(12) United States Patent
Tanaka et al.

(10) Patent No.: US 6,653,629 B2
(45) Date of Patent: Nov. 25, 2003

(54) SPECIMEN INSPECTION INSTRUMENT

(75) Inventors: Yukihiro Tanaka, Saitama (JP); Sadao Matsumoto, Tokyo (JP); Toru Ishimoto, Saitama (JP); Hirofumi Miyao, Tokyo (JP)

(73) Assignee: JEOL Ltd., Tokyo (JP)

( * ) Notice: Subject to any disclaimer, the term of this patent is extended or adjusted under 35 U.S.C. 154(b) by 83 days.

(21) Appl. No.: 09/876,853

(22) Filed: Jun. 7, 2001

(65) Prior Publication Data

US 2002/0008201 A1 Jan. 24, 2002

(30) Foreign Application Priority Data

Jun. 9, 2000 (JP) ........................................ 2000-173385

(51) Int. Cl.$^7$ ............................ G01N 23/00; G21K 7/00
(52) U.S. Cl. ........................ 250/306; 250/307; 250/311
(58) Field of Search ................................ 250/306, 307, 250/310, 311

(56) References Cited

U.S. PATENT DOCUMENTS 5,466,936 A * 11/1995 Kohama et al. ............. 250/310
5,939,715 A *  8/1999 Kitamura et al. ........... 250/234
6,465,781 B1 * 10/2002 Nishimura et al. ......... 250/306

* cited by examiner

Primary Examiner—John R. Lee
Assistant Examiner—Paul M. Gurzo
(74) Attorney, Agent, or Firm—Webb Ziesenheim Logsdon Orkin & Hanson, P.C.

(57) ABSTRACT

A specimen inspection instrument has a specimen-moving mechanism mounted within a specimen chamber. An electrical current, induced across the specimen by the mechanism, is detected with a detector. The specimen is examined based on the obtained detector output signal. An amplifier for amplifying the detector output signal is placed outside the specimen chamber. A first lead wire passes the detector output signal to the outside amplifier through the wall of the specimen chamber. A second lead wire connects a conductive partition member with a conducting member and with a reference input terminal of the amplifier that determines a reference potential for the output from the amplifier.

16 Claims, 11 Drawing Sheets

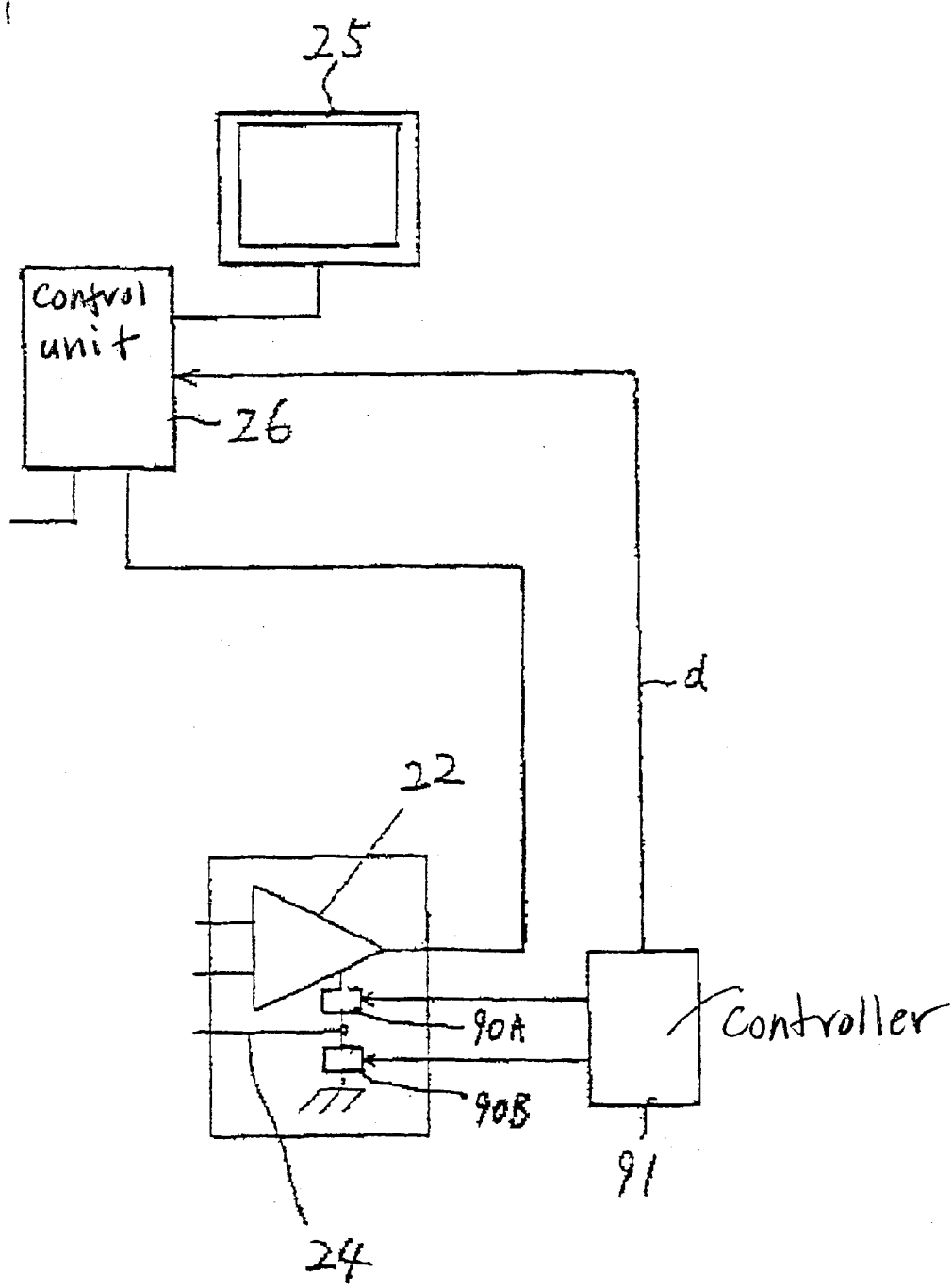

Fig. 12

STEP 1 — initial setting measurement "OFF" SW33, 34 on

2 — introducing a wafer

3 — aligning the wafer

4 — setting measurement conditions

5 — moving to the first measurement position

6 — measurement "ON" SW33, 34 off

7 — impinging electron beam / current measurement

8 — measurement "OFF" SW33, 34 on

9 — carrying out the wafer

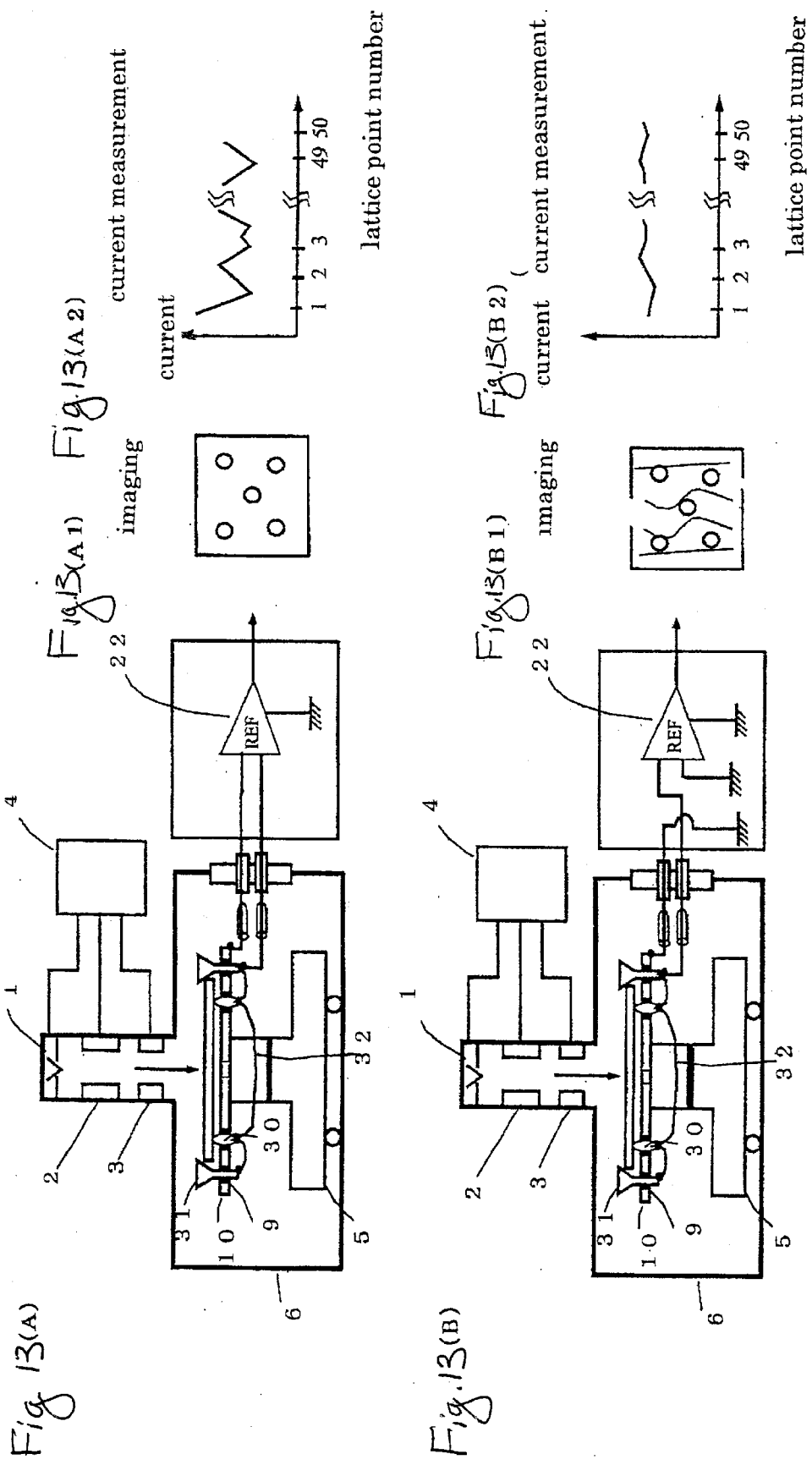

SPECIMEN INSPECTION INSTRUMENT

BACKGROUND OF THE INVENTION

1. Field of the Invention

The present invention relates to a specimen inspection instrument for inspecting a specimen by impinging the specimen with a primary beam such as an electron beam or laser beam and, more particularly, to a specimen inspection instrument capable of detecting a very weak electrical current flowing through a specimen.

2. Description of the Related Art

In a scanning electron microscope, a sharply focused electron beam is directed to a specimen and scanned across it. Secondary electrons or reflected (back-scattered) electrons produced from the specimen are detected with a detector. A detector output signal obtained thereby is sent to a display device to produce a secondary electron image or reflected electron image of the specimen. In another conventional procedure, electrons absorbed by the specimen and flowing through the specimen toward ground potential are detected as a specimen current, and the detected current is sent to a display device to display an electrical current image of the specimen.

Where a specimen current is detected, the current of the primary electron beam impinging on the specimen is usually as small as on the order of picoamperes. Therefore, a weaker current must be detected. This requires that the instrument can prevent mixing of noises caused by electromagnetic waves from its surroundings. Consequently, the specimen is placed within a specimen chamber having an electromagnetic shielding function.

Although the specimen chamber having an electromagnetic shielding function is capable of shielding the specimen from electromagnetic waves from its surroundings, a positioning mechanism placed within the specimen chamber for moving the specimen includes a drive motor. This motor can be a source of electromagnetic waves. Consequently, it is difficult to precisely amplify the specimen current at a high amplification factor. Especially, where the specimen is large, it is inevitable to use a large-sized specimen-moving mechanism. As a result, intenser electromagnetic waves are emitted, producing greater effects.

SUMMARY OF THE INVENTION

In view of the foregoing, the present invention has been made. It is an object of the present invention to provide a specimen inspection instrument permitting precise detection of specimen currents.

A first embodiment of the present invention, which achieves this object, lies in an instrument for inspecting a specimen by impinging a primary beam onto a surface of the specimen insulatively held to a specimen-moving mechanism mounted within a specimen chamber, detecting the resulting electrical current through the specimen with a detector, and inspecting the specimen based on the thus obtained detector output signal. This instrument is characterized in that it has an amplifier having a reference input terminal and placed outside the specimen chamber to amplify the detector output signal, a first lead wire for passing the detector output signal to the outside amplifier through the wall of the specimen chamber, a conductive partition member insulatively inserted between the specimen and the specimen-moving mechanism to form a partition electrically isolated therefrom, and a second lead wire for connecting the conductive partition member with a conducting member and with the reference input terminal of the amplifier. This conducting member is placed around the portion of the first lead wire passing through the wall of the specimen chamber. The reference input terminal determines a reference potential for the output from the amplifier.

A second embodiment of the present invention lies in an instrument for inspecting a specimen by impinging a primary beam onto a surface of the specimen insulatively held to a specimen-moving mechanism placed within a specimen chamber, detecting the resulting electrical current through the specimen with a detector, and inspecting the specimen based on the resulting detector output signal. This instrument is characterized in that it has a differential amplifier having a reference input terminal and placed outside the specimen chamber to amplify the detector output signal, a first lead wire for passing the detector output signal to the outside differential amplifier through the wall of the specimen chamber, a second lead wire for connecting the specimen-moving mechanism with a conducting member and with the reference input terminal of the differential amplifier, a conductive specimen holder acting to hold the specimen and insulatively held by the specimen-moving mechanism, and a third lead wire for passing the signal from the specimen holder to a second input terminal of the outside differential amplifier through the wall of the specimen chamber. The conducting material is placed around the portion of the first lead wire passing through the wall of the specimen chamber. The reference input terminal determines a reference potential for the output from the amplifier.

A third embodiment of the present invention lies in an instrument for inspecting a specimen by impinging a primary beam onto a surface of the specimen, detecting the resulting electrical current through the specimen with a detector, and inspecting the specimen based on the obtained detector output signal. This instrument is characterized in that an antenna is placed close to the specimen and that the difference between the signal from the antenna and the current through the specimen is taken as the detector output signal.

A fourth embodiment of the present invention lies in a specimen analysis instrument for inspecting a specimen by impinging a primary beam onto a surface of the specimen insulatively held to a specimen-moving mechanism placed within a specimen chamber, detecting an electrical current induced across the specimen with a detector, and inspecting the specimen based on a resulting detector output signal. This instrument is characterized in that it has a differential amplifier for amplifying said detector output signal, said differential amplifier having input terminals, a first lead wire for passing the detected electrical current flowing through the specimen to said differential amplifier, an antenna mounted close to said specimen, a second lead wire for passing a signal from said antenna to said differential amplifier, and a selector means for switching the input terminals of said differential amplifier between a grounded state and an ungrounded state.

A fifth embodiment of the present invention lies in a specimen analysis instrument for inspecting a specimen by impinging a primary beam onto a surface of the specimen insulatively held to a specimen-moving mechanism placed within a specimen chamber, detecting an electrical current induced across the specimen with a detector, and inspecting the specimen based on a resulting detector output signal. This instrument is characterized in that it has a differential amplifier for amplifying said detector output signal, said differential amplifier having input terminals, a first lead wire for passing the detected electrical current flowing through the specimen to said differential amplifier, an antenna mounted close to said specimen, a second lead wire for passing a signal from said antenna to said differential amplifier, and a single-input amplifier for amplifying the detected current taken out via said first lead wire.

Other objects and features of the present invention will appear in the course of the description thereof, which follows.

BRIEF DESCRIPTION OF THE DRAWINGS

FIGS. 13(A), 13(A1), 13(A2), 13(B), 13(B1) and 13(B2) are diagrams illustrating the difference made between where an amplifier is used with differential inputs and where the amplifier is used with a single input;

DESCRIPTION OF THE PREFERRED EMBODIMENTS

Figure 1:
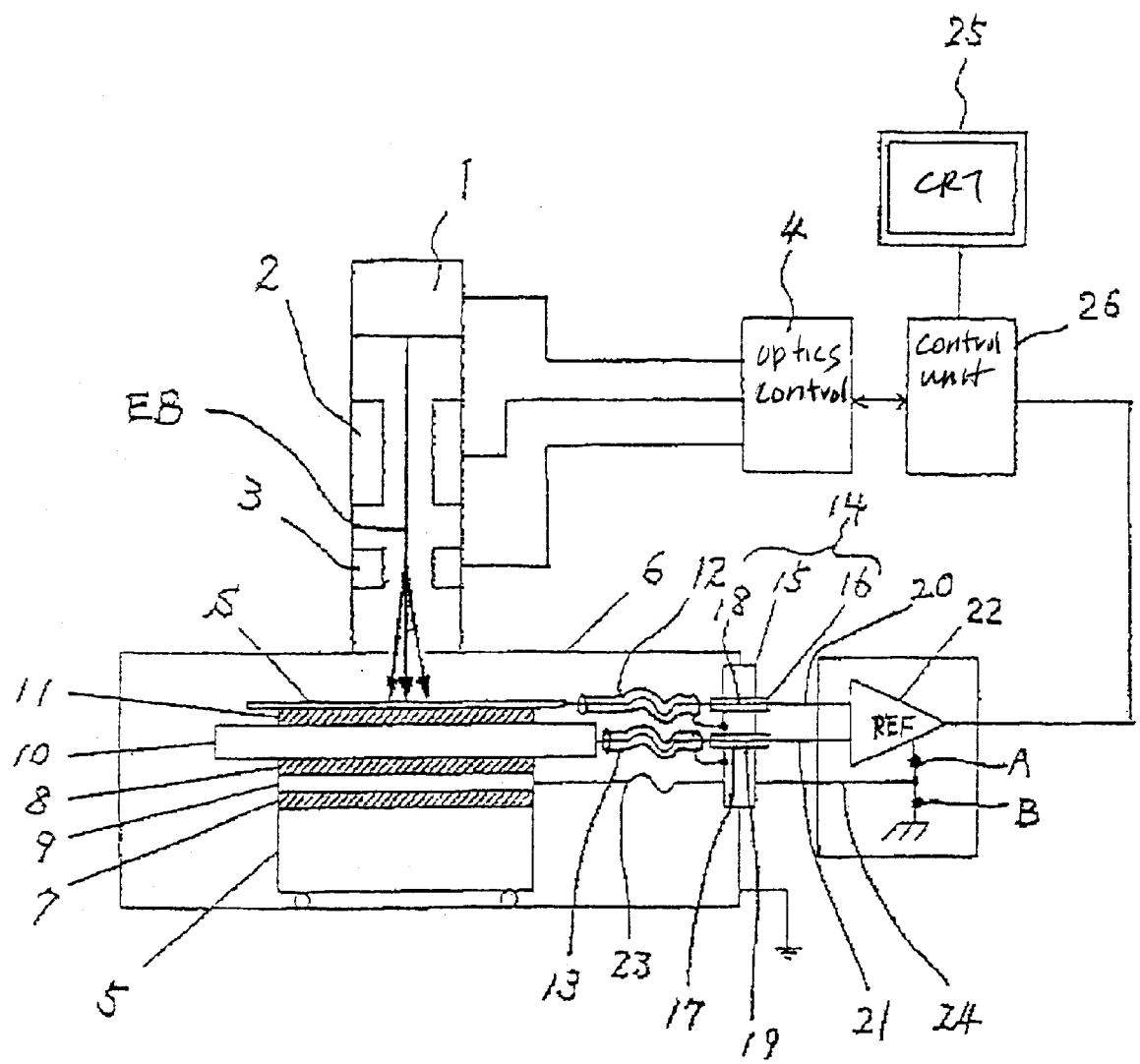
FIG. 1 is a diagram of a scanning electron microscope in accordance with one embodiment of the present invention.

Embodiments of the present invention are hereinafter described with reference to the accompanying drawings. Referring to FIG. 1, there is shown a scanning electron microscope in accordance with the present invention. This microscope has an electron gun 1 emitting an electron beam EB that is sharply focused onto a specimen S by a system of condenser lenses 2. The beam is scanned across the specimen in two dimensions by a deflector 3. The electron gun 1, the system of condenser lenses 2, and the deflector 3 are controlled by an electron-optics controller 4.

The specimen S is placed on a specimen-moving mechanism 5 and accommodated in a specimen chamber 6 designed to have electromagnetic shielding functions for preventing intrusion of unwanted extraneous electric and magnetic fields. That is, the specimen chamber 6 acts as an electrostatic shield and as a magnetic shield. The specimen-moving mechanism 5 has a top portion consisting of three layers, i.e., two layers of insulating material 7, 8 and a conductive partition plate 9 interposed between the two layers of insulating material 7, 8. A conductive specimen holder 10 is placed on the insulating material 8 that is at the surface. An insulative plate 11 is placed on this specimen holder 10. The specimen S is placed on this insulative plate 11, i.e., above the specimen holder 10 via the insulative plate 11.

Lead wires (coaxial lines) 12 and 13 are connected with the specimen S and the specimen holder 10, respectively. A terminal 14 for taking out signals to the outside via the lead wires is mounted in the wall of the specimen chamber 6. The terminal 14 comprises a conductive substrate 15 directly mounted to the conductive wall of the specimen chamber, insulators 16, 17 extending through the substrate 15, and core lines 18, 19 extending through the insulators, respectively. Lead wires 20 and 21 connected with the core lines, respectively, are connected with differential input terminals, respectively, of a differential amplifier 22. The outer conductors of the lead wires 12 and 13 are connected with the substrate 15.

The partition plate 9 and the substrate 15 are connected together by a lead wire 23. The differential amplifier 22 has a reference input terminal (REF) connected with the substrate 15 by a lead wire 24. This reference input terminal is grounded at a ground point that constitutes a ground point for the accelerating voltage source, the ground point forming a reference point for generation of the electron beam from the electron gun 1. The differential output signal from the differential amplifier 22 is sent to a control unit 26 equipped with a memory and a monitor 25. The signal is converted into digital data by the control unit 26 and stored in the memory. The control unit 26 receives from the aforementioned electron-optical controller a signal indicative of the position on the specimen hit by the electron beam. In response to this signal, the control unit 26 stores the digital data in association with the hit position (i.e., the position at which data is taken).

In the structure described above, an electrical current is induced between the specimen-moving mechanism and the specimen chamber due to electromagnetic fields produced by the specimen-moving mechanism. As a result, the potential at the specimen-moving mechanism varies. In the prior art instrument, the potential at the specimen varies by the effects of variations of the potential at the specimen-moving mechanism. Therefore, the amplifier set at a high amplification factor to detect the specimen current is affected and thus its output varies. Consequently, it has been difficult to amplify the specimen current precisely.

In the present invention, the partition plate is mounted between the specimen-moving mechanism and the specimen and electrically insulated from them. This partition plate is placed at the same potential as the substrate of the terminal by a lead wire. Furthermore, the reference input terminal (REF) of the differential amplifier 22 is placed at the same potential as the substrate of the terminal by lead wires. As a result, the specimen and the specimen holder are shielded by the partition plate. Consequently, if the potential at the specimen-moving mechanism varies, the resulting variations are prevented from being transmitted to the specimen and to the specimen holder. In addition, if the potential at the partition plate varies somewhat due to variation of the potential at the specimen-moving mechanism, the differential amplifier 22 produces a differential output based on the potential at the partition plate and so it can stably amplify the specimen current without output saturation.

Furthermore, in the present embodiment, the difference between the current from the specimen and the current from the specimen holder is taken by the differential amplifier. Therefore, if noise components are introduced into the specimen current by the effects of electromagnetic waves arising from the specimen-moving mechanism or other component, substantially identical noise components are introduced into both currents, because the specimen holder is placed close to the specimen. It follows that the differential amplifier cancels out the noise components of the current signals obtained from the specimen and the specimen holder, respectively. In consequence, a precise signal of the specimen current free from such noise components can be derived as the output from the differential amplifier.

In the embodiment described above, the currents produced by the effects of electromagnetic waves coming from the specimen-moving mechanism or other component are detected using the specimen holder. Alternatively, a separate antenna may be mounted close to the specimen. The signal detected by this antenna may be sent to the differential amplifier 22 via the lead wire 13. For example, this antenna can be insulatively mounted to the outer periphery of the specimen holder.

Figure 9:
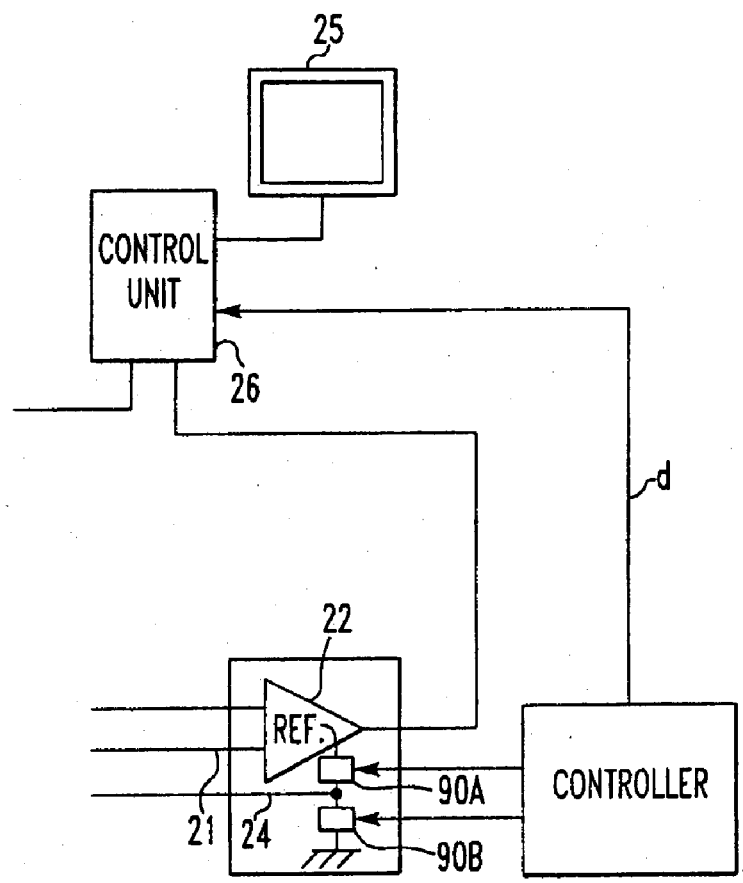
FIG. 9 is a diagram illustrating a structure for applying a potential to the point A or B in the embodiment illustrated in FIG. 1.
Figure 10:
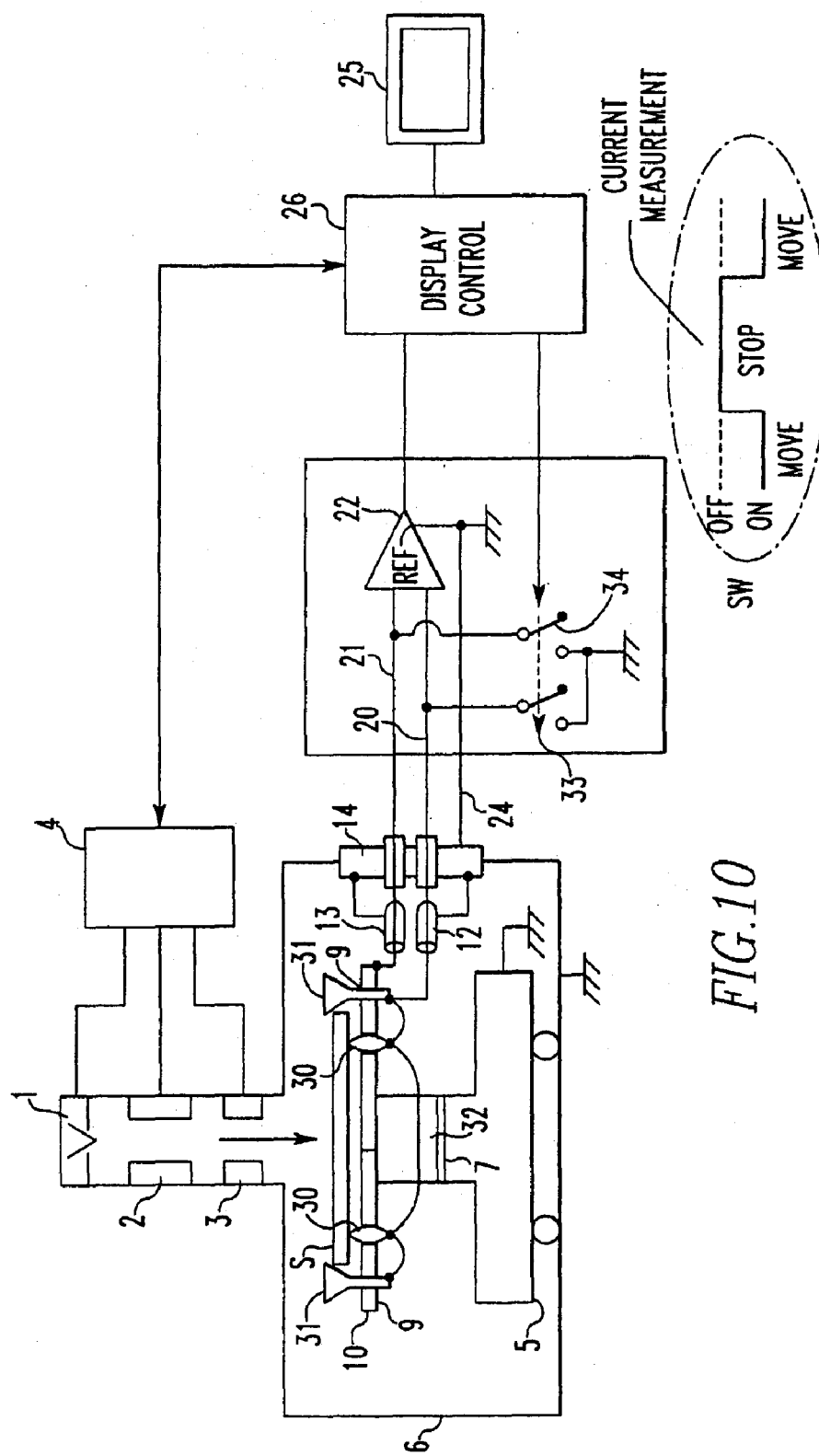
Figure 11A:
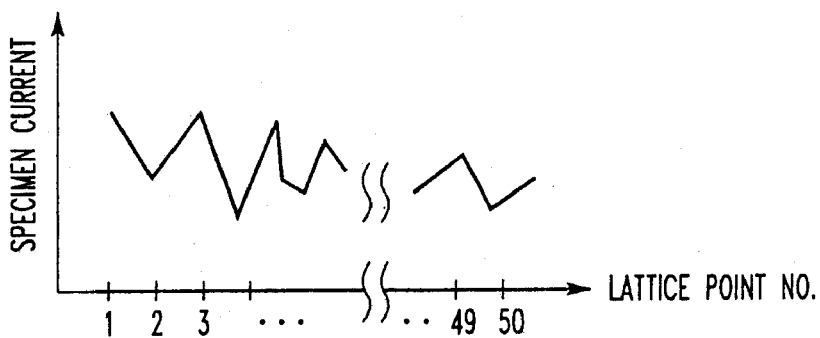
Figure 11B:
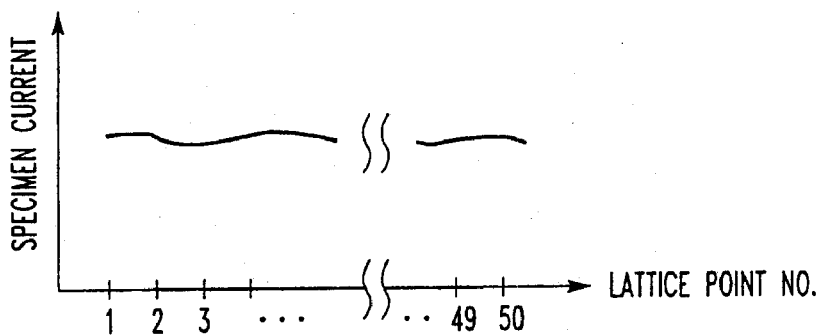
Figure 15:
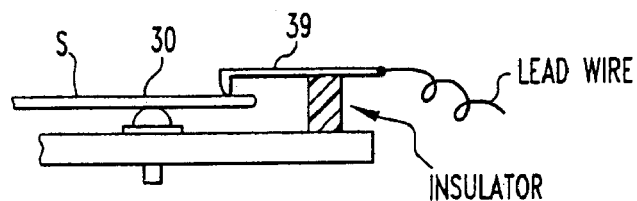

Moreover, an appropriate DC voltage may be applied to the reference input terminal (REF) of the differential amplifier 22 of the construction shown in FIG. 1 by inserting a positive variable voltage source 90A or a negative variable voltage source 90B, as particularly shown in FIG. 9, at the point A or B between the reference input terminal (REF) of the differential amplifier 22 and the ground point. In FIG. 9, a potential controller 91 controls the voltage generated by the variable voltage source 90A or 90B and supplies synchronizing information d to the control unit 26, if necessary.

For example, where the specimen is a semiconductor device, P- or N-channel semiconductor and insulating layer are formed on the surface, depending on the implanted dopant. It is known that if a primary beam is directed onto these materials, the amount of electrical current flowing through the specimen varies, depending on the material and on the energy of the primary beam. Where a potential is applied to the reference potential point A or B of the differential amplifier by the configuration shown in FIG. 9, it follows that a potential is supplied to the specimen surface via the input terminal of the differential amplifier. This can cause an apparent change in the primary beam energy. In addition, the specimen current can be detected such that the potential application does not vary the input signal to the amplifier.

The potential can be applied to the point A or B by the potential controller 91. The applied potential is within the range of the power-supply potential of the amplifier, and may be a positive or negative DC or various waveforms varying with time. Where a periodic variation is given, the control unit 26 can grasp the relation between the amount of change of the detected current and the applied potential by sending information about the variations in the potential as synchronizing information d to the control unit 26. Thus, data can be analyzed precisely.

Figure 2:
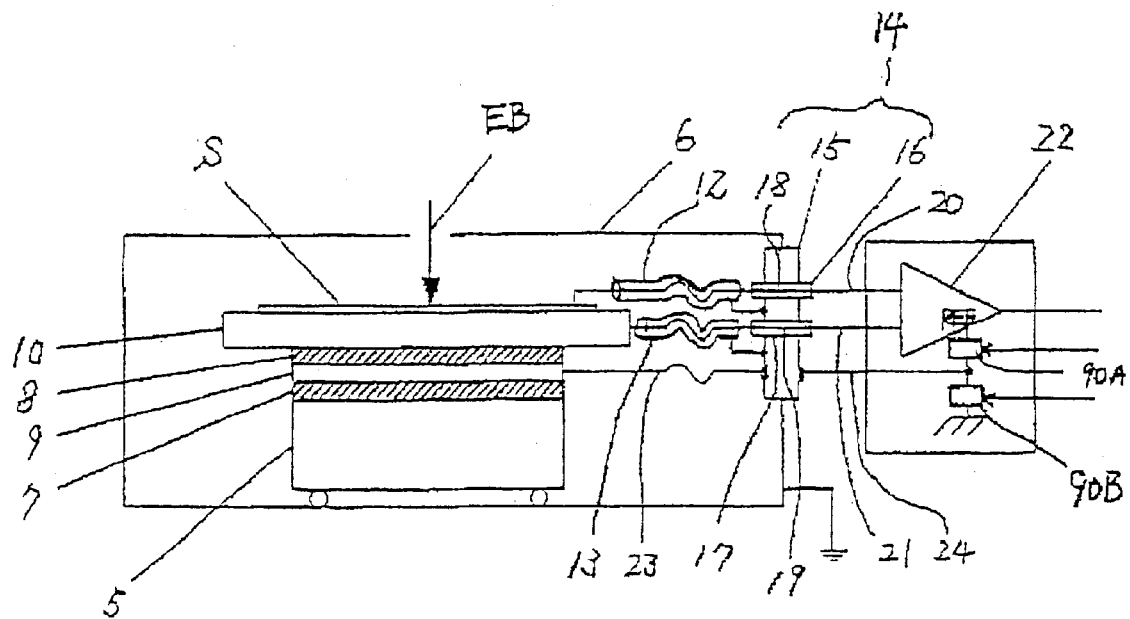
FIG. 2 is a diagram of a specimen chamber and a differential amplifier included in a microscope in accordance with another embodiment of the present invention.

FIG. 2 is a diagram showing the specimen chamber and the differential amplifier of another embodiment of the present invention. The present embodiment is similar to the embodiment described previously in connection with FIG. 1 except that the insulative material 11 between the specimen S and the specimen holder 10 is omitted to permit the specimen holder 10 to touch the specimen S and that lead wires are connected with electrodes in contact with the surface of the specimen S.

In this structure, the partition plate 9 provides a shielding effect. The difference between the surface potential of the specimen and the potential at the rear of the specimen can be found by the differential amplifier 22. As a consequence, a signal corresponding to the degree of easiness with which an electrical current flows from the front to rear surface of the specimen (i.e., resistance encountered in going from the front to the rear surface) at the point hit by the electron beam can be obtained. Data about a two-dimensional image regarding such resistance of the specimen can be obtained by scanning.

Figure 3:
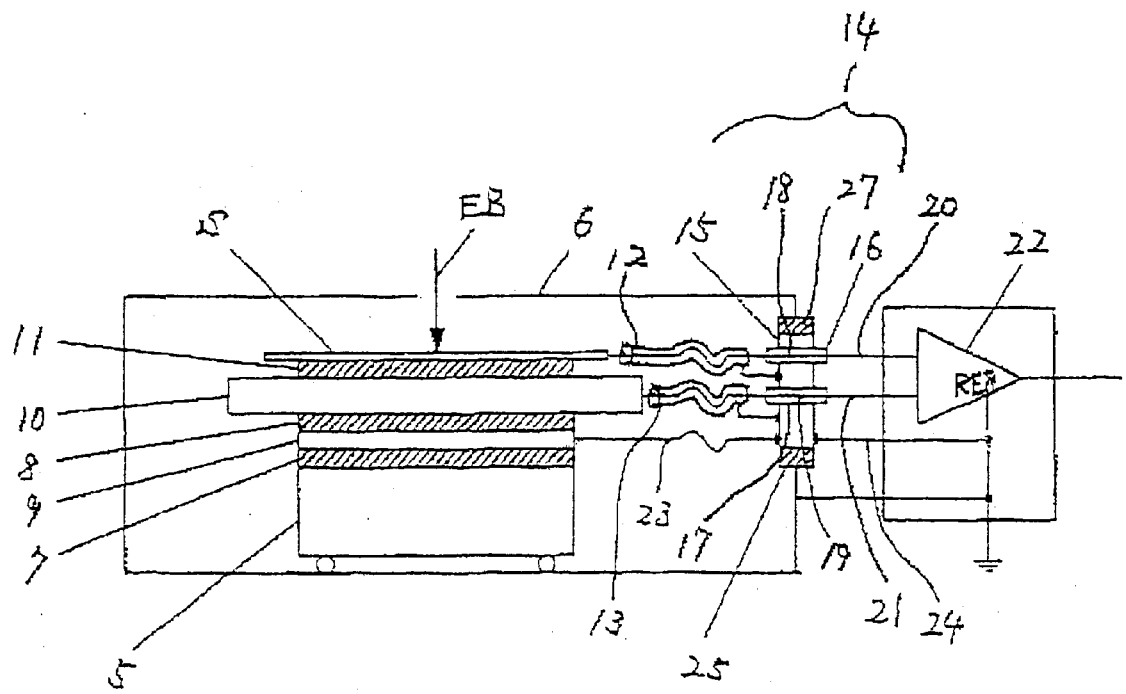
FIG. 3 is a diagram of a specimen chamber and a differential amplifier included in a microscope in accordance with a further embodiment of the present invention.

FIG. 3 is a diagram showing the structures of the specimen chamber and the differential amplifier of a further embodiment of the present invention. This embodiment is similar to the embodiment described already in connection with FIG. 1 except that the terminal is electrically isolated from the specimen chamber 6 by an insulating material 27. This embodiment is advantageous where the distance between the specimen chamber 6 and the differential amplifier 22 is large.

Figure 4:
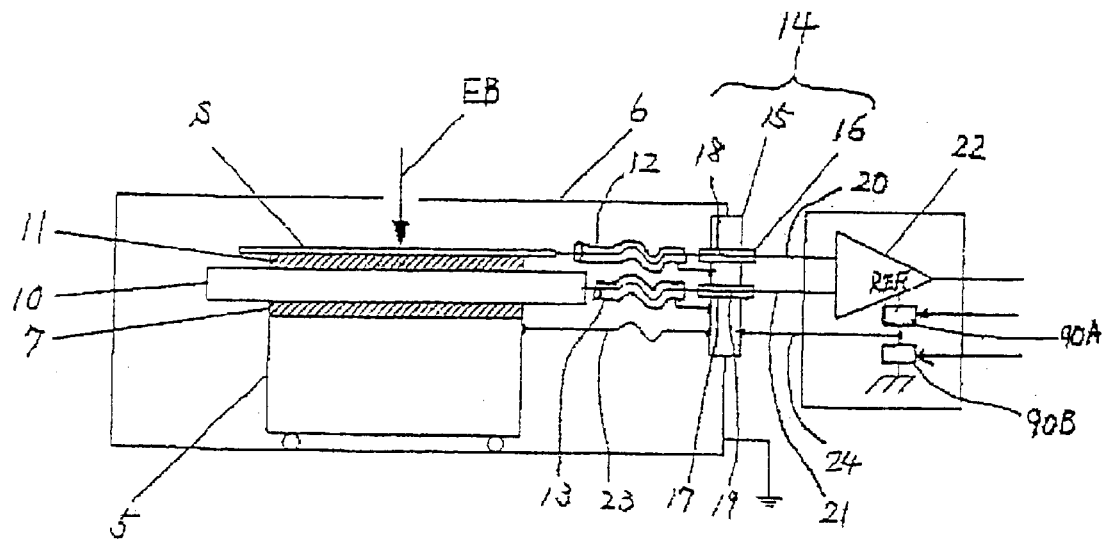
FIG. 4 is a diagram of a specimen chamber and a differential amplifier included in a microscope in accordance with still another embodiment of the present invention.

FIG. 4 is a diagram showing the structures of the specimen chamber and the differential amplifier of an additional embodiment of the present invention. This embodiment is similar to the embodiment described already in connection with FIG. 1 except that the partition plate is omitted and that a lead wire 23 is connected with the specimen-moving mechanism 5. If the potential at the specimen-moving mechanism 5 varies, the differential amplifier 22 produces a differential output based on the potential at the specimen-moving mechanism 5. Hence, the amplifier can amplify the specimen current stably without output saturation. The embodiment illustrated in FIG. 4 is suited to cases where potential variations occurring with the specimen-moving mechanism 5 are relatively small.

Figure 5:
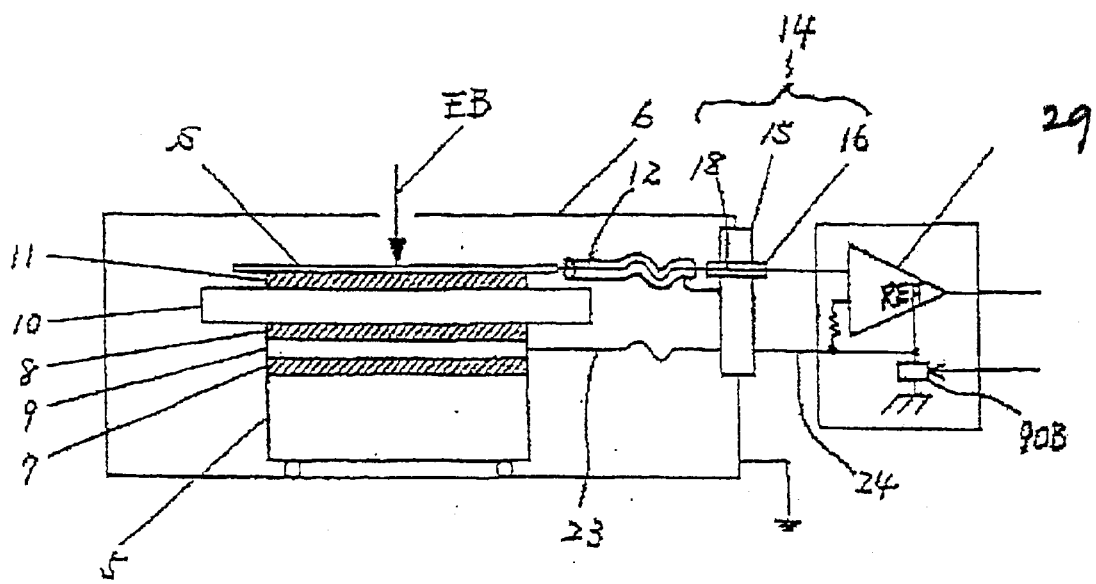
FIG. 5 is a diagram of a specimen chamber and a differential amplifier included in a microscope in accordance with yet another embodiment of the present invention.

FIG. 5 shows the configuration of still another embodiment of the present invention. This embodiment is similar to the embodiment described previously in connection with FIG. 1 except that the differential amplifier 22 is replaced by a simple inverting or non-inverting amplifier 29 and that the lead wire interconnecting the specimen holder 10 and the amplifier 30 is omitted. In the present embodiment, it cannot be expected that noise will be removed by using the specimen holder as an antenna and causing the differential amplifier to find the difference between the current from the antenna and the specimen current. However, if the potential at the partition plate 9 varies slightly by the effects of variations in the potential at the specimen-moving mechanism 5, the partition plate 9 sandwiched between the insulators 11 and 8 acts as a capacitor operating as a noise filter. The amplifier 30 produces an output based on the potential at the partition plate 9. Therefore, the amplifier can stably amplify the specimen current without output saturation.

Figure 6:
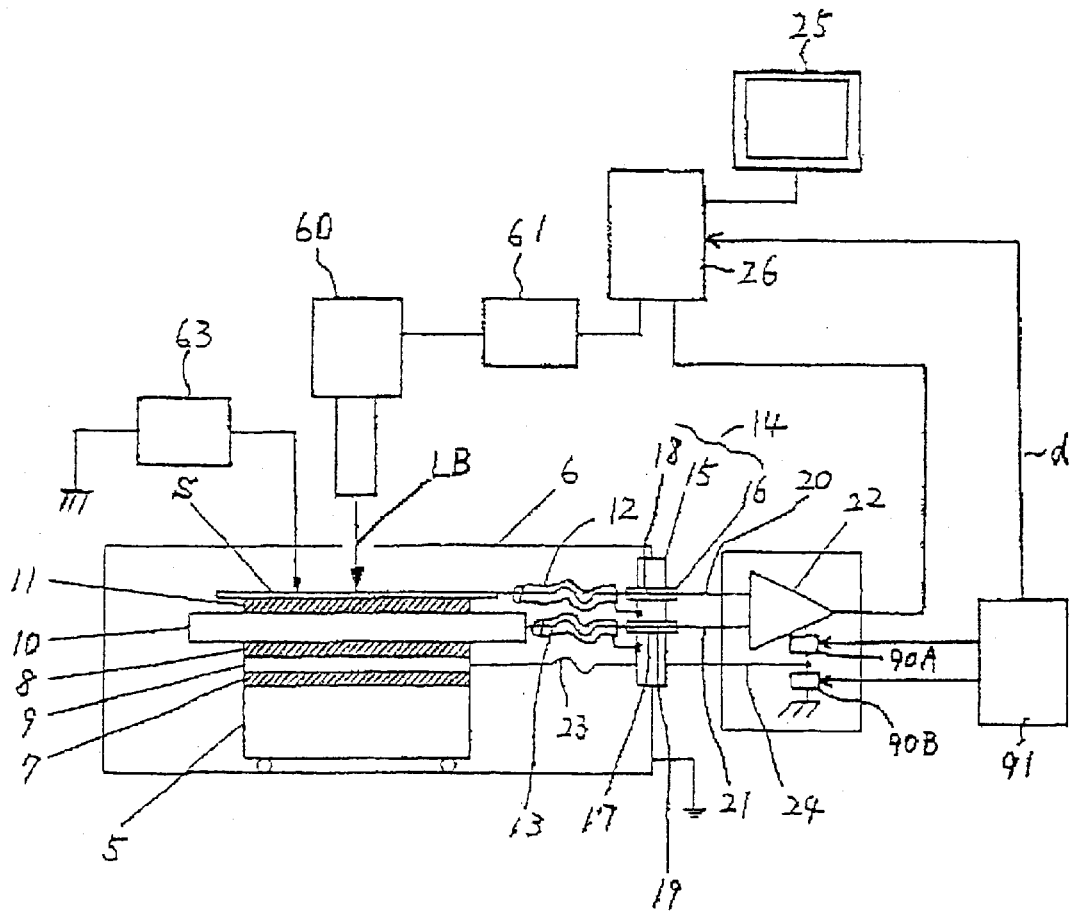
FIG. 6 is a diagram of a specimen chamber and a differential amplifier included in a microscope in accordance with an additional embodiment of the present invention.

FIG. 6 shows the configuration of yet another embodiment of the present invention. In the present embodiment, the invention is applied to a specimen analysis instrument (e.g., a laser microscope equipped with an OBIC (Optical Beam Induced Current) detection circuit) for detecting an electrical current (e.g., OBIC current) induced in a specimen by impinging a laser beam onto the specimen. In FIG. 6, those components which are identical with their counterparts of FIG. 1 are indicated by the same reference numerals as in FIG. 1. In FIG. 6, an optical microscope unit 60 is equipped with a laser light source, a light scanning mechanism, and a reflected light detector. The optical microscope unit impinges a sharply focused laser beam LB onto a specimen S and scans the beam across the specimen. The optical microscope unit is capable of detecting light reflected from the specimen. A microscope control circuit 61 controls the laser light source and the light scanning mechanism.

The specimen S is placed on the specimen-moving mechanism 5 in the same way as in the embodiment of FIG. 1, and is accommodated in a specimen chamber 6 designed to have electromagnetic shielding functions to prevent intrusion of unwanted electric and magnetic fields from the outside. That is, the specimen chamber 6 acts as an electrostatic shield and also as a magnetic shield. The specimen-moving mechanism 5 has a top surface consisting of three layers, i.e., two layers of insulating material 7, 8 and a conductive partition plate 9 sandwiched between the layers of insulating material 7, 8. A conductive specimen holder 10 is placed on the insulating material 8 at the surface. An insulating material 11 is placed on the specimen holder 10. The specimen S is placed on the insulating material 11, i.e., above the specimen holder 10 via the insulative plate 11. Also shown in FIG. 6 is a power supply 63, for example, for supplying a voltage to a power supply line on a circuit formed on the specimen.

Figure 7:
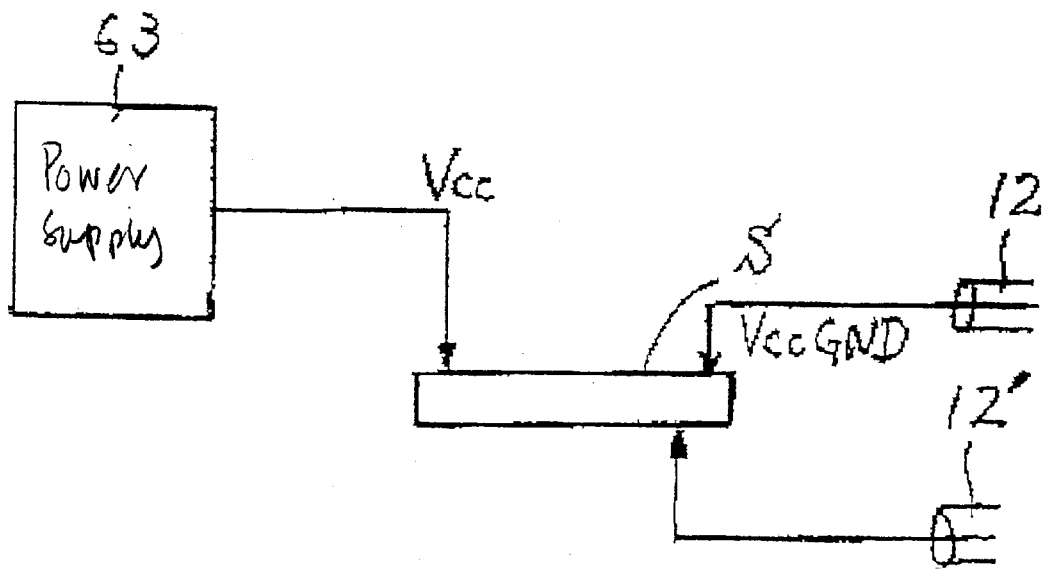
FIG. 7 is a diagram illustrating the manner in which a voltage is applied to a specimen S shown in FIG. 6 and an electrical current is taken out.

In the structure described above, the wavelength and the output of the laser light source installed in the microscope unit 60 are so set that an OBIC or OBIRCH (Optical Beam Induced Resistance Change) is induced. A substrate on which a semiconductor circuit is built, for example, is set as the specimen S in the specimen holder. As shown in FIG. 7, an appropriate voltage is applied from the power supply 63 to an electrode of a power supply line (e.g., Vcc) for a circuit formed on the specimen, using a contactor. A lead wire 12 for connection with the input terminal of the amplifier 22 is connected with a ground-side electrode (VccGND) of the power supply line for the circuit formed on the specimen, using a contactor.

Under this condition, the sharply focused laser beam LB is illuminated onto the specimen surface and scanned in two dimensions. If an OBIC (Optical Beam Induced Current) phenomenon takes place at the point hit by the laser beam, a quite weak OBIC current flows from this location on the power supply line toward ground. This OBIC current is sent via the lead wire 12 to the amplifier 22, where the current is amplified. Furthermore, the current is fed to a control unit 26, where the current is stored in association with the position hit by the laser beam. A structural analysis of the semiconductor circuit can be performed by knowing the position on the specimen at which such an OBIC current is produced.

In the above embodiment, the lead wire 12 is connected with the ground-side electrode VccGND of the power supply line formed on the specimen, and the OBIC current flowing from the power supply line toward ground is detected. Sometimes, the OBIC current may flow from the power supply line toward other circuit pattern or the rear surface of the specimen. Where such an OBIC current is detected, it is necessary, of course, to connect the lead wire 12' to this circuit pattern or the rear surface of the specimen.

In the present embodiment, a partition plate is mounted between the specimen-moving mechanism and the specimen while electrically isolated from them. This partition plate is placed at the same potential as the substrate of the terminal by a lead wire. The reference input terminal REF of the differential amplifier 22 is placed at the same potential as the substrate of the terminal by a lead wire. Furthermore, the reference input terminal REF of the differential amplifier 22 is placed at the same potential by the lead wire 12. Alternatively, depending on the terminal used for measurement, point A or B may be placed at the same potential as Vcc. As a result, the specimen and the specimen holder are shielded by the partition plate. This prevents variations in the potential at the specimen-moving mechanism from being transmitted to the specimen and to the specimen holder. In addition, if the potential at the partition plate is varied only a little by the effects of variations in the potential at the specimen-moving mechanism, the differential amplifier 22 produces a differential output based on the potential at the partition plate. Therefore, the amplifier can stably amplify the OBIC current without output saturation. Moreover, if a dynamic current flowing through a circuit to be detected is superimposed on the OBIC current, the OBIC current can be stably amplified without output saturation even if the dynamic current through the inspected circuit varies, by varying the potential at the point A or B according to the dynamic current variations, using the potential controller 91.

Figure 8:
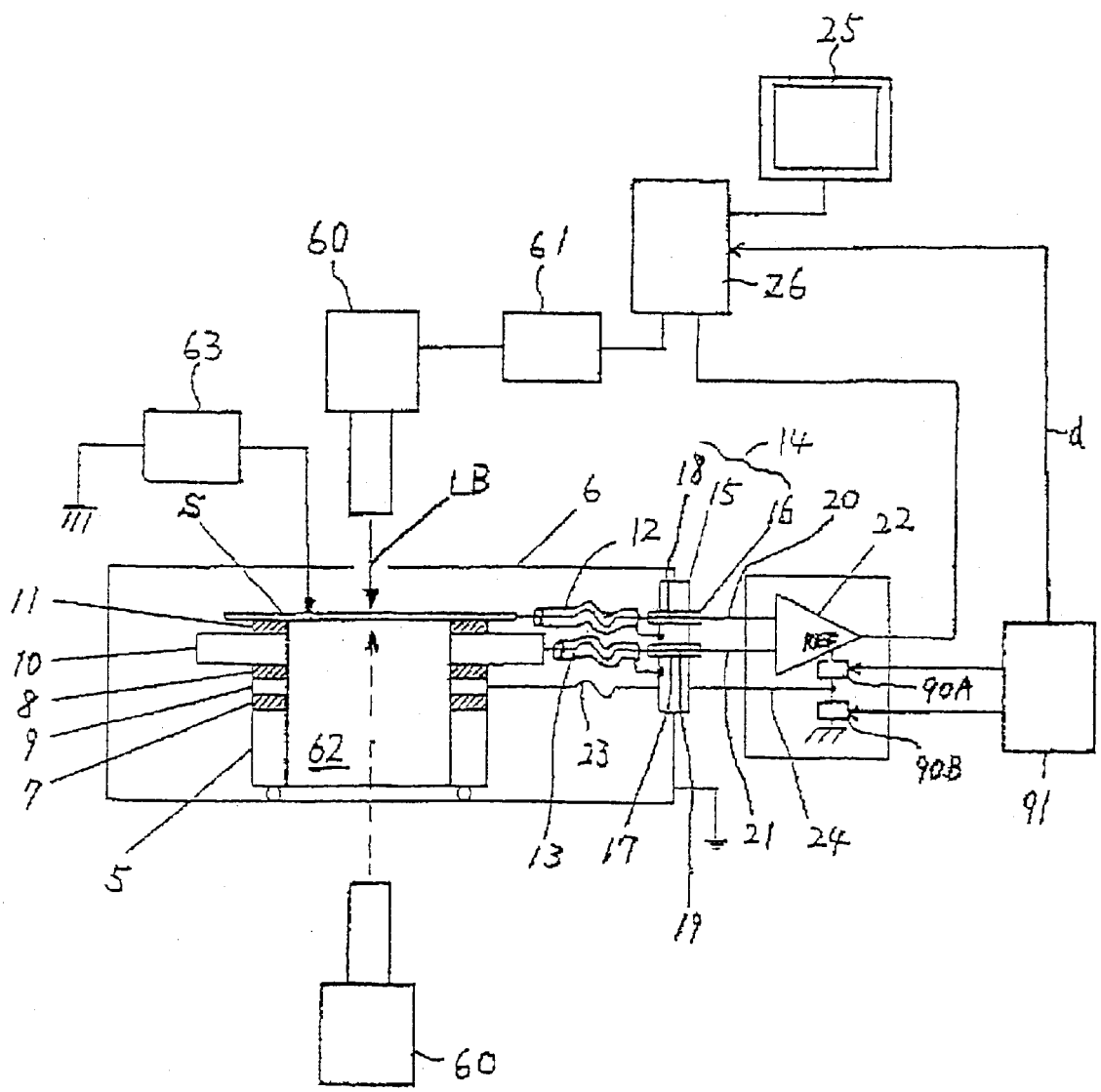
FIG. 8 is a diagram similar to the diagram of FIG. 6, but in which a laser beam is directed to the specimen from below.

Furthermore, in the present embodiment, the difference between the current from the specimen and the current from the specimen holder is taken by the differential amplifier. Therefore, if noise components are introduced into the OBIC current by the effects of electromagnetic waves arising from the specimen-moving mechanism or other component, a substantially equal noise component is introduced into the current signal from the specimen holder because it is disposed close to the specimen. It follows that the differential amplifier cancels out these two kinds of noise components. A precise signal of the OBIC current free from noise components can be obtained as an output from the differential amplifier.

Where a laser beam is illuminated onto the rear surface of the specimen from below, it is necessary to secure a path below the specimen to pass the laser beam as shown in FIG. 8. That is, in FIG. 8, the specimen-moving mechanism 5 and the insulators 7, 8, conductive partition plate 9, specimen holder 10, and insulative plate 11 placed on the moving mechanism 5 are centrally cut away to form a through-hole 62. This makes it possible to place the microscope unit 60 in a lower position and to illuminate the laser beam onto the rear surface of the specimen. In this case, the shielding effects of the partition plate weaken somewhat but other advantages can be obtained in the same way as the embodiment illustrated in FIG. 6.

Figure 10:
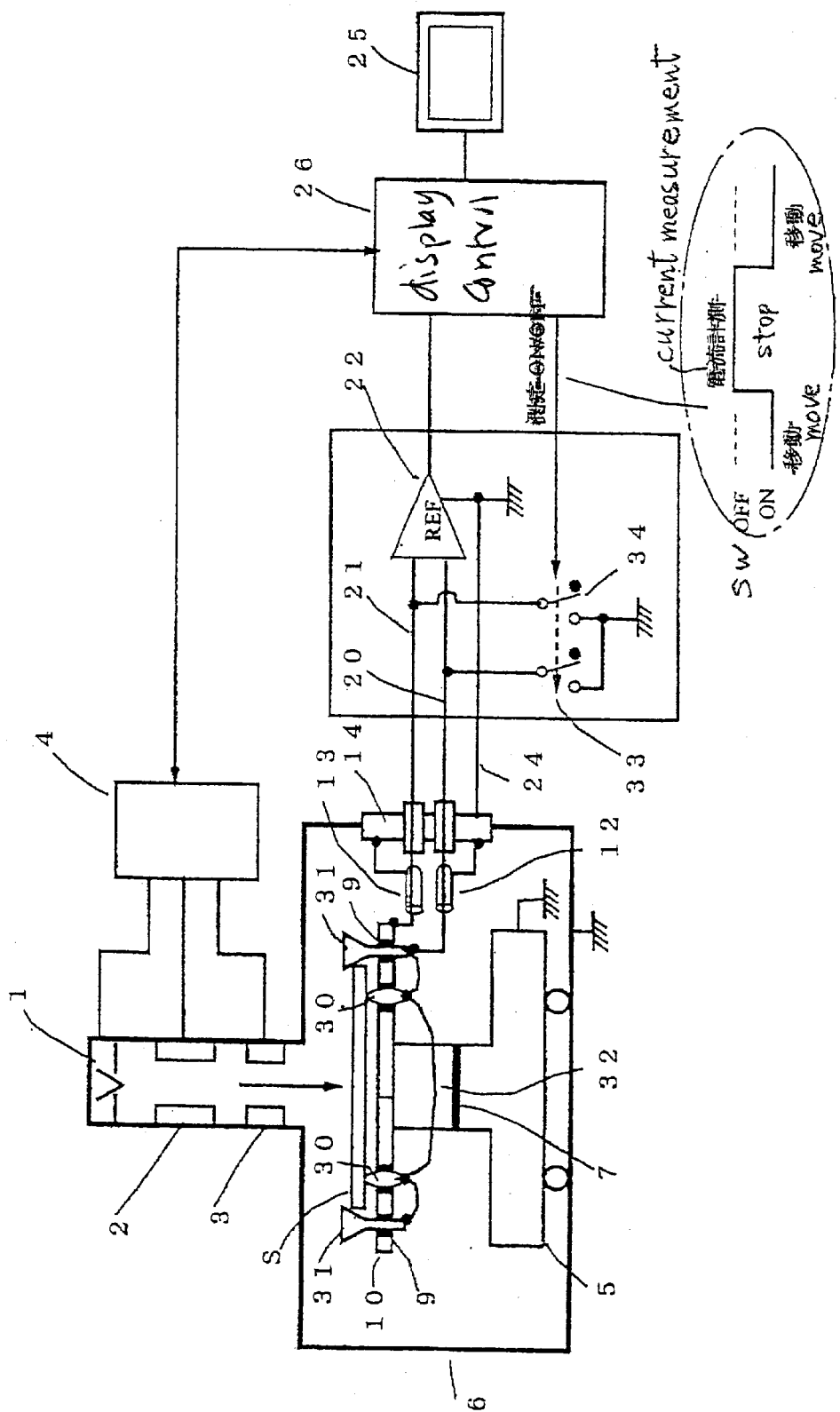
FIG. 10 is a diagram of still another embodiment of the present invention.

FIG. 10 is a diagram illustrating the configuration of a still further embodiment of the present invention. In FIG. 10, a specimen S such as a silicon wafer is held substantially horizontal by a plurality of pins 30. Motion of the fringes of the specimen S is restricted by a plurality of (two pairs of, for example) holddown rollers 31 such that the specimen is held between them and the specimen is held to the specimen holder 10. The pins 30 and the holddown rollers 31 are insulatively mounted to the specimen holder 10 by insulators 9. A wire 32 for detecting the current flowing through the specimen is connected with the pins 30 and with the holddown rollers 31. A lead wire 12 for passing the current to the differential amplifier 22 is connected with the wire 32.

Switches 33 and 34 are used to ground the input terminals of the differential amplifier 22. The switches 33 and 34 are simultaneously turned on and off by an instruction signal from a display control unit 26.

The structure of the present embodiment is advantageous where the specimen S is moved using the specimen-moving mechanism 5 to successively shift the measurement point on the specimen at which the current flowing through the specimen is measured. This will be described in further detail below.

Figure 11A:
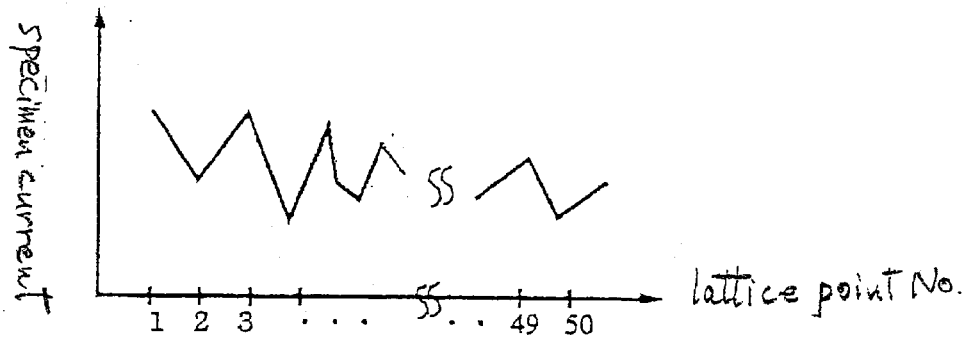
FIGS. 11(a) and 11(b) are diagrams illustrating the manner in which the specimen current varies as the specimen is moved where a bare wafer is used as the specimen.

FIG. 11(A) shows the results of repeated measurements made on lattice points assumed on a specimen by moving the specimen in equal steps by the specimen-moving mechanism 5. In FIG. 11(A), lattice point number is plotted on the horizontal axis, while the specimen current value taken at each lattice point is plotted on the vertical axis. A reference specimen showing uniform specimen current value over the whole specimen surface (e.g., a so-called bare wafer, that is, a mirror-like wafer not yet treated at all) is used as the specimen. Accordingly, the specimen current values measured at all lattice points should be equal. However, actual measurement results indicate that the specimen current values measured at lattice points are different from each other, as shown in FIG. 11(A).

The measurement results are due to the following facts. When the specimen holder 10 is moved during movement of the specimen S, the electric charge on the specimen holder 10 is varied by variations in the stray capacitance within the specimen chamber and by the effects of noise. After the specimen holder comes to a stop, the measured specimen current varies.

Accordingly, in the present embodiment, the switches 33 and 34 are provided to permit the input terminals of the differential amplifier 22 to be switched between a grounded state and an ungrounded state. As shown in the circular insert of FIG. 10, the control unit 26 turns on the switches 33 and 34 during movement made by the specimen-moving mechanism 5 to ground the input terminals of the differential amplifier 22. After the movement, if an electron beam is illuminated in a stationary state and the specimen current is measured, the control unit 26 turns off the switches 33 and 34.

Figure 12:
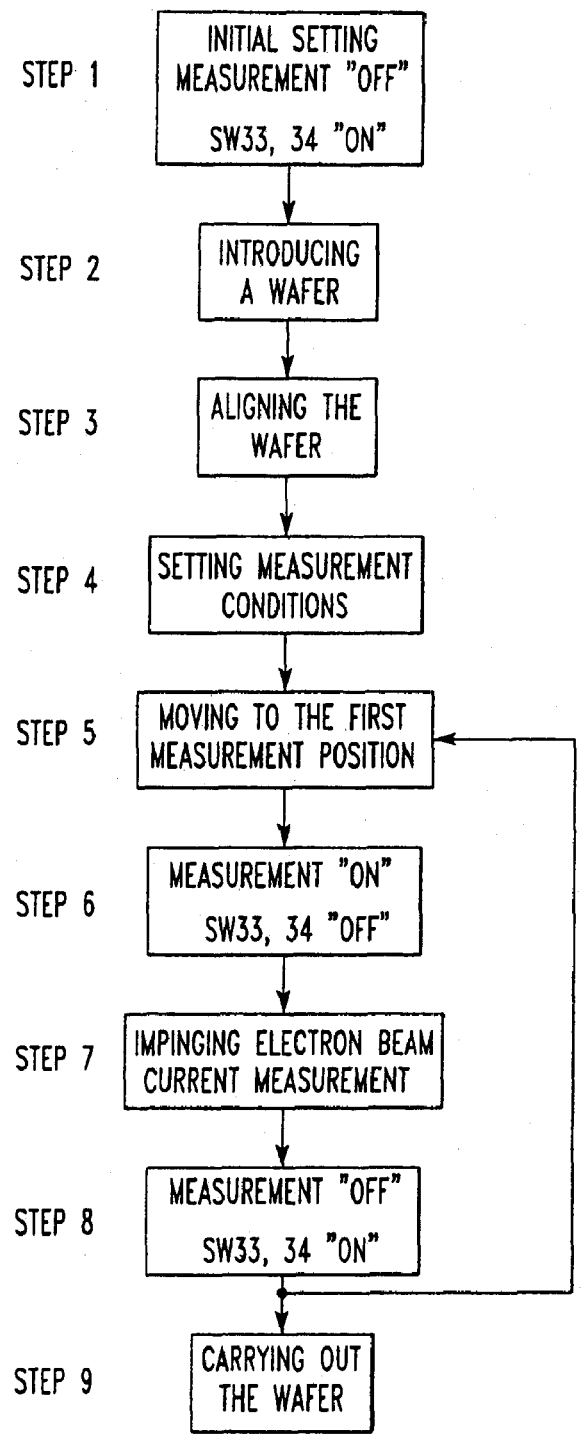
FIG. 12 is a flowchart illustrating procedures for carrying out measurements in the embodiment illustrated in FIGS. 13(A)–13(B2)

FIG. 12 is a flowchart illustrating measurement procedures based on the control operations described above. In step 1, the switches 33 and 34 are turned off (the measurement is not performed) as an initial setting operation. In step 2, a wafer that is a specimen is conveyed into the specimen chamber and set on the holder 10. In step 3, the wafer is aligned to bring it into its initial position. In step 4, various measurement conditions including the electron beam impingement time, the timing of the impingement, and the gain of the differential amplifier are set. In step 5, a first measurement point on the specimen is brought to the beam-hit position by the specimen-moving mechanism 5. In step 6, if the specimen comes to a stop, the switches 33 and 34 are turned off. In step 7, the electron beam EB is emitted and the specimen current is measured. After the measurement, the switches 33 and 34 are turned on in step 8 to inhibit measurements. Control then returns to step 5, where the specimen is moved to bring the next measurement point to the beam-hit position. Steps 5–8 are repeatedly carried out for a desired number of measurement points. Finally, the wafer undergone the measurement is conveyed out of the specimen chamber in step 9.

Figure 11B:
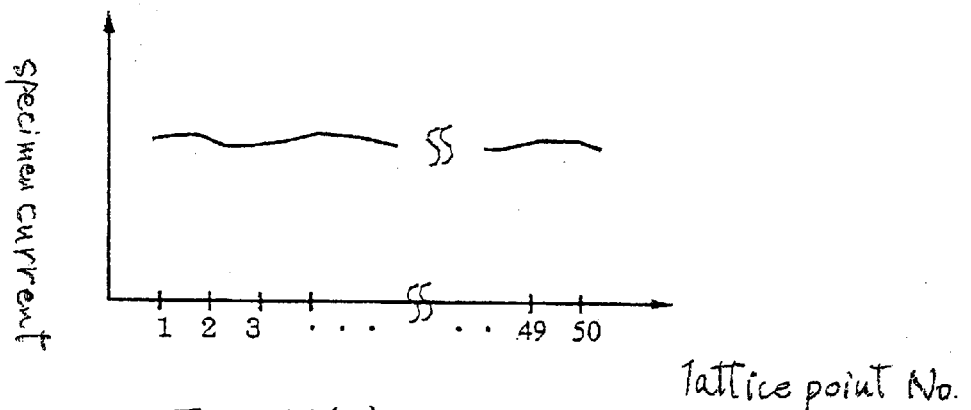

FIG. 11(B) shows the results of measurements of a bare wafer performed in the same way as in FIG. 11(A) while effecting this sequence of control operations. It can be seen from this figure that variations of the specimen current values at various lattice points caused by the movement as shown in FIG. 11(A) are suppressed by turning on the switches 33 and 34 to ground the input terminals of the differential amplifier 22 during movement made by the specimen-moving mechanism 5.

In the embodiment illustrated in FIG. 10, where the specimen current is measured, there are two modes of measurement. In one mode, the obtained current value is directly used as measurement results, i.e., current measurement. In the other mode, the detected signal intensity is converted into a brightness level to obtain image data, i.e., imaging.

Figures 13, 13B:
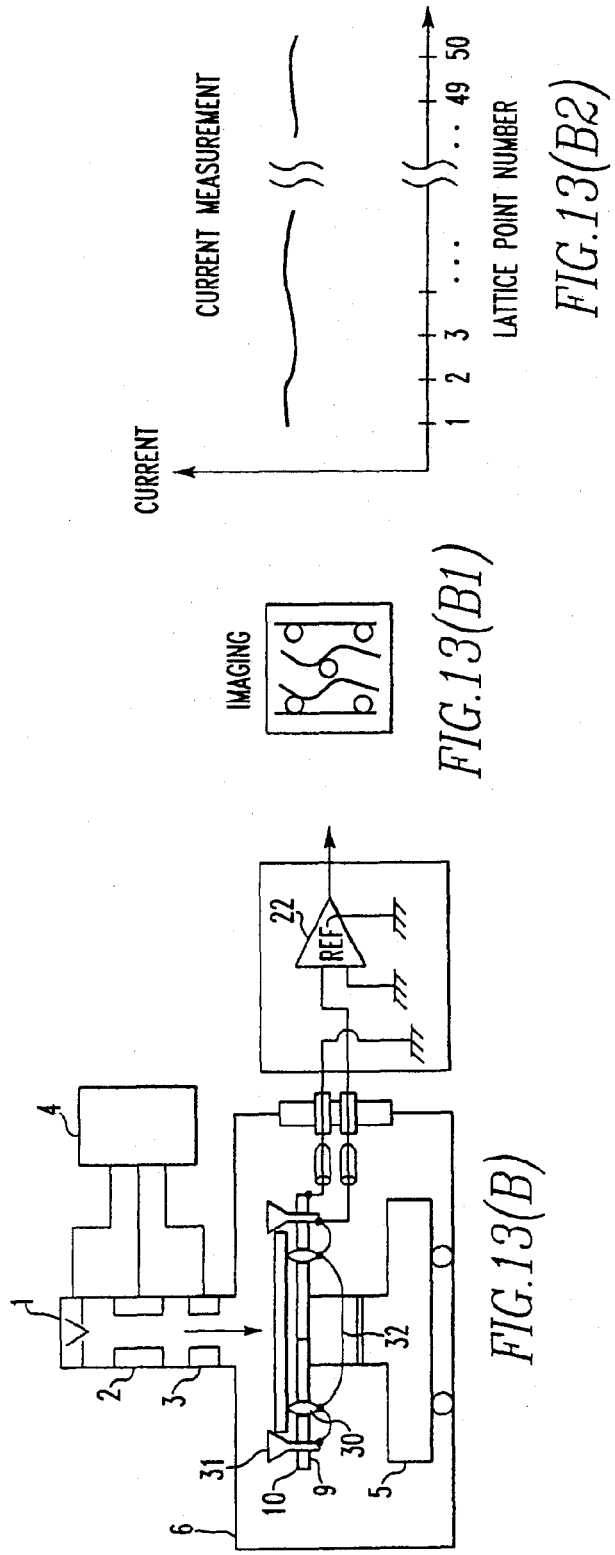
Figure 14:
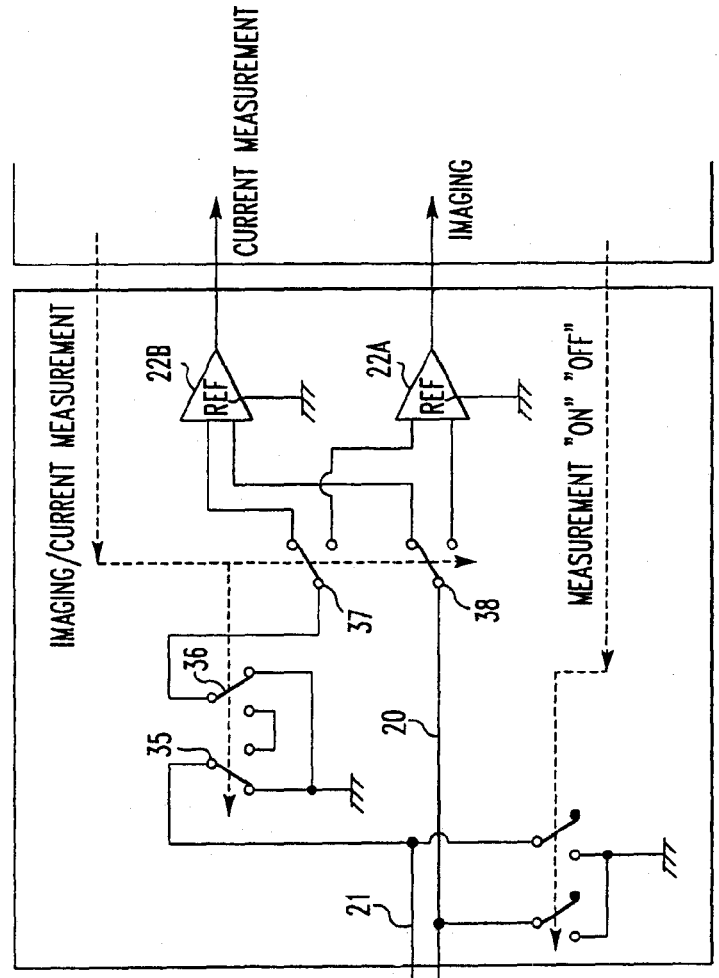

We have performed current measurements and imaging for a case in which the input circuit of the differential amplifier 22 of the embodiment illustrated in FIG. 10 is differential inputs as shown in FIG. 13(A) and for a case in which one side is grounded and there is one input as shown in FIG. 13(B). The results of the imaging are shown in FIGS. 13(A1) and 13(B1). The results of the current measurements are shown in FIGS. 13(A2) and 13(B2).

Where the amplifier 22 is used with differential inputs, the measured electrical current varied as shown in FIG. 13(A2), though a bare wafer was used as a specimen. This is a phenomenon as already described in the embodiment illustrated in FIG. 10. However, in the case of imaging, a high-quality image having a quite small amount of noise as shown in FIG. 13(A1) could be collected.

On the other hand, where the amplifier 22 is used with a single input and currents are measured, variations were suppressed sufficiently as shown in FIG. 13(B2). However, in the case of imaging, noise of the AC line frequency was observed to be introduced into the obtained image as shown in FIG. 13(B1).

Figure 14:
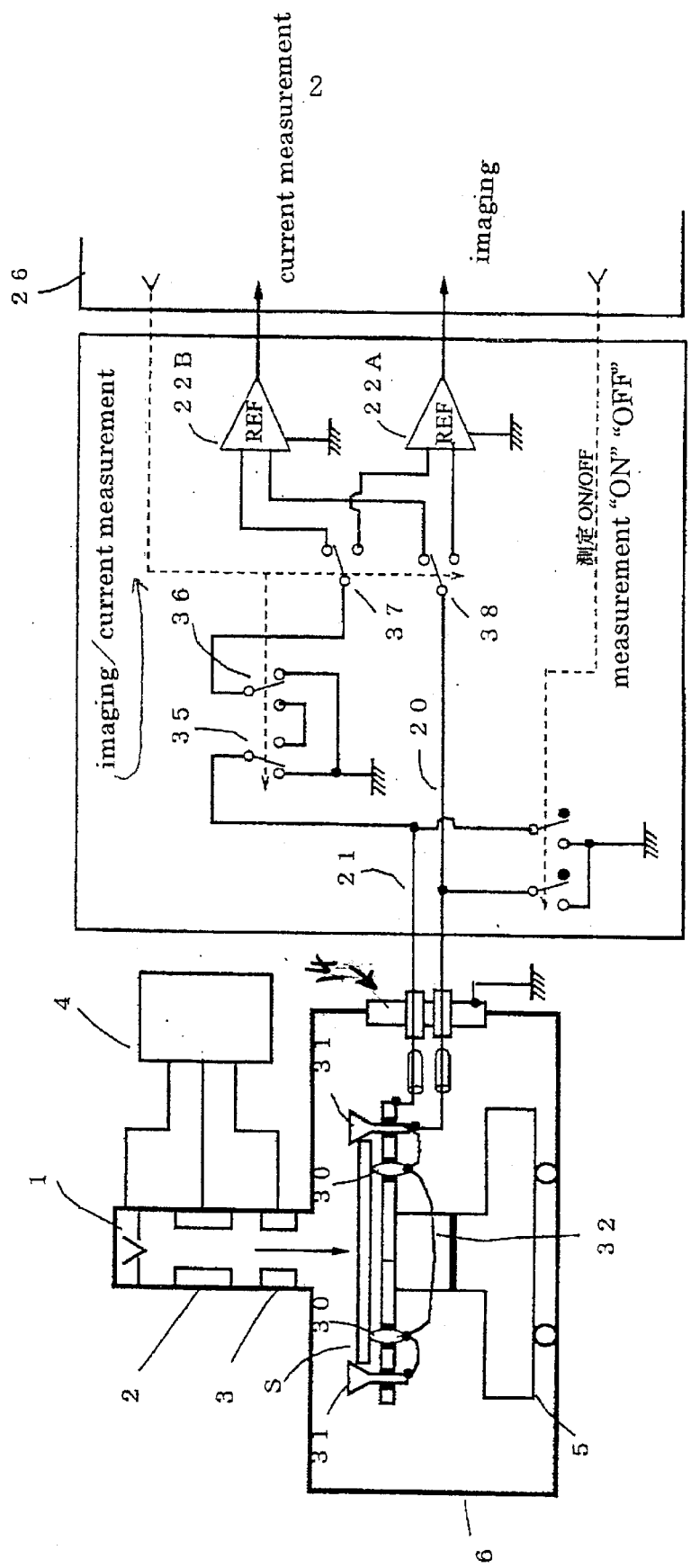
FIG. 14 is a diagram of an additional embodiment of the present invention.
Figure 1:
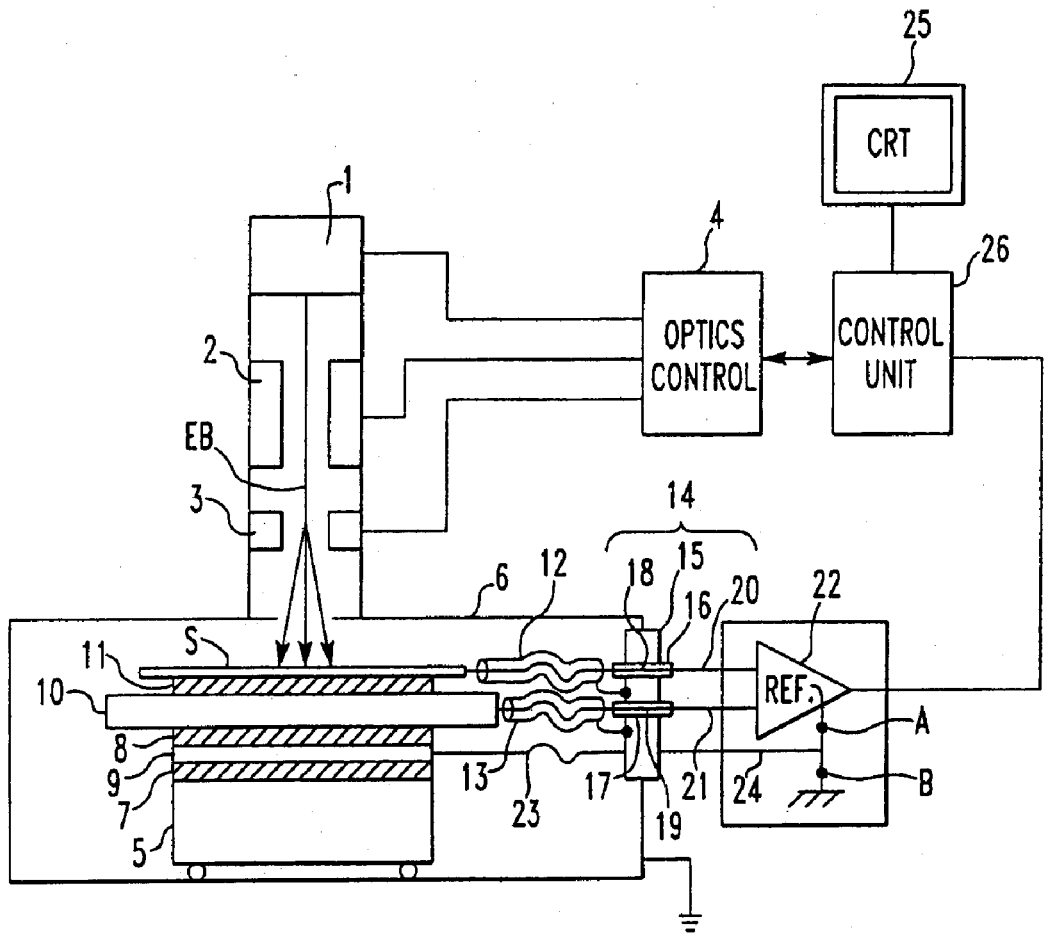
Figure 2:
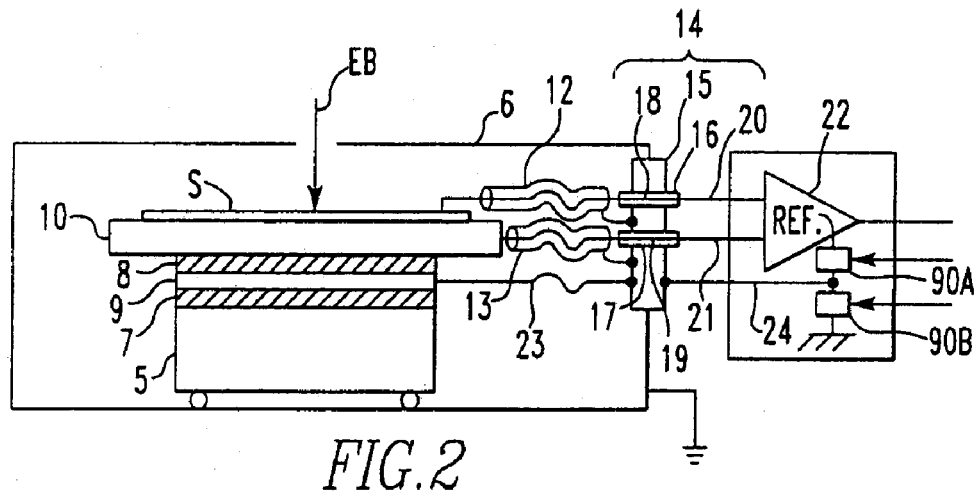
Figure 3:
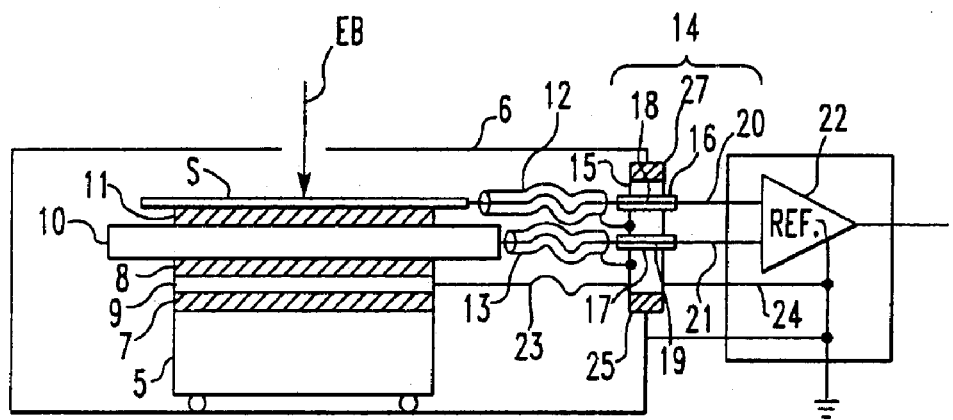
Figure 4:
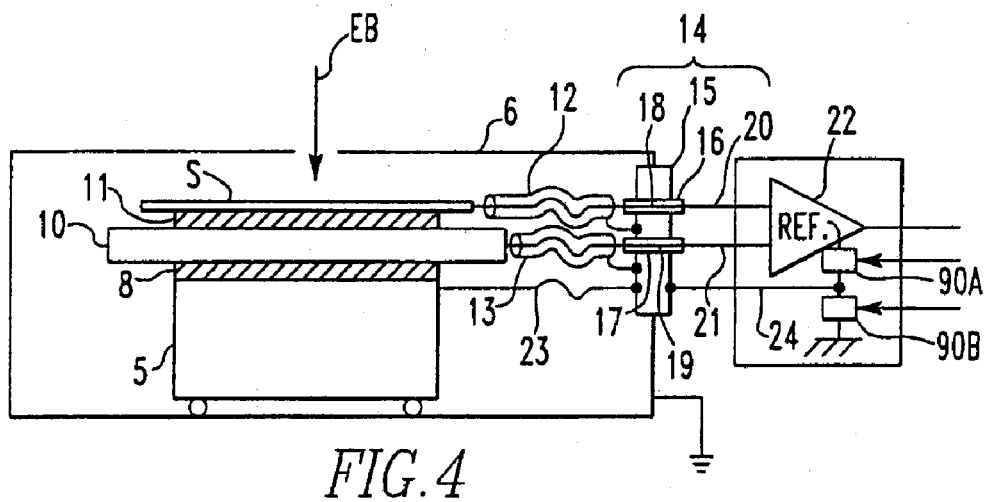
Figure 5:
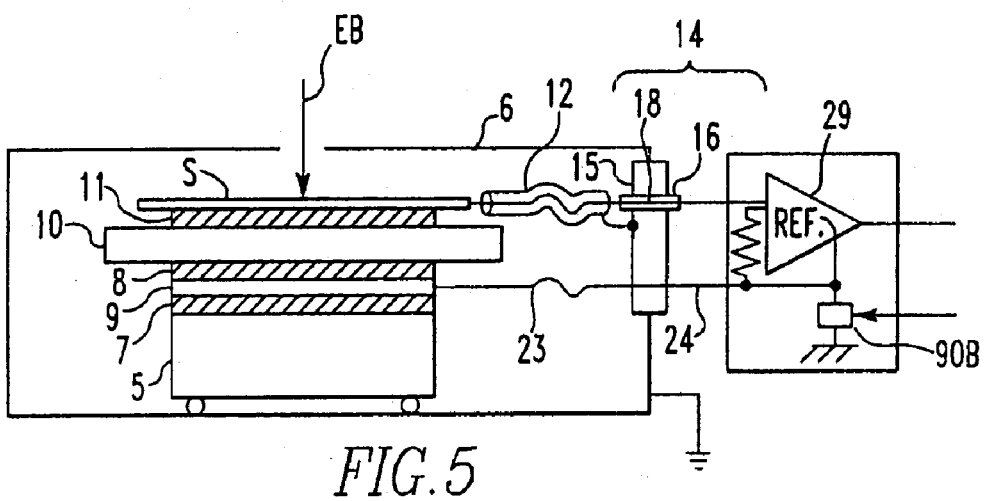
Figure 6:
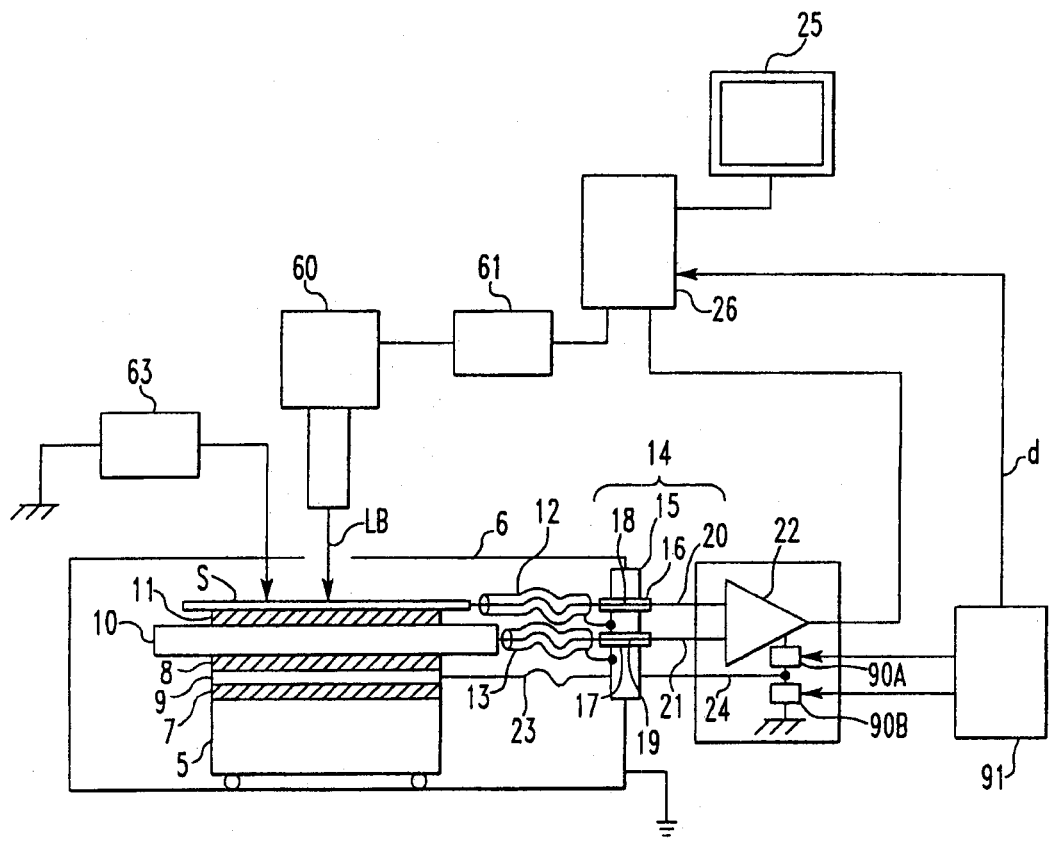
Figure 7:
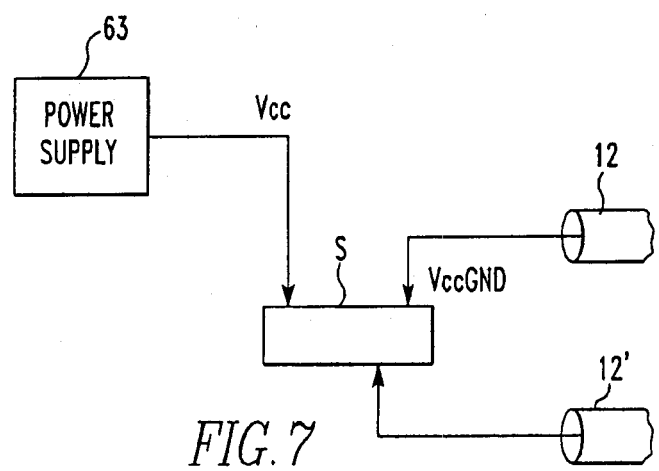
Figure 8:
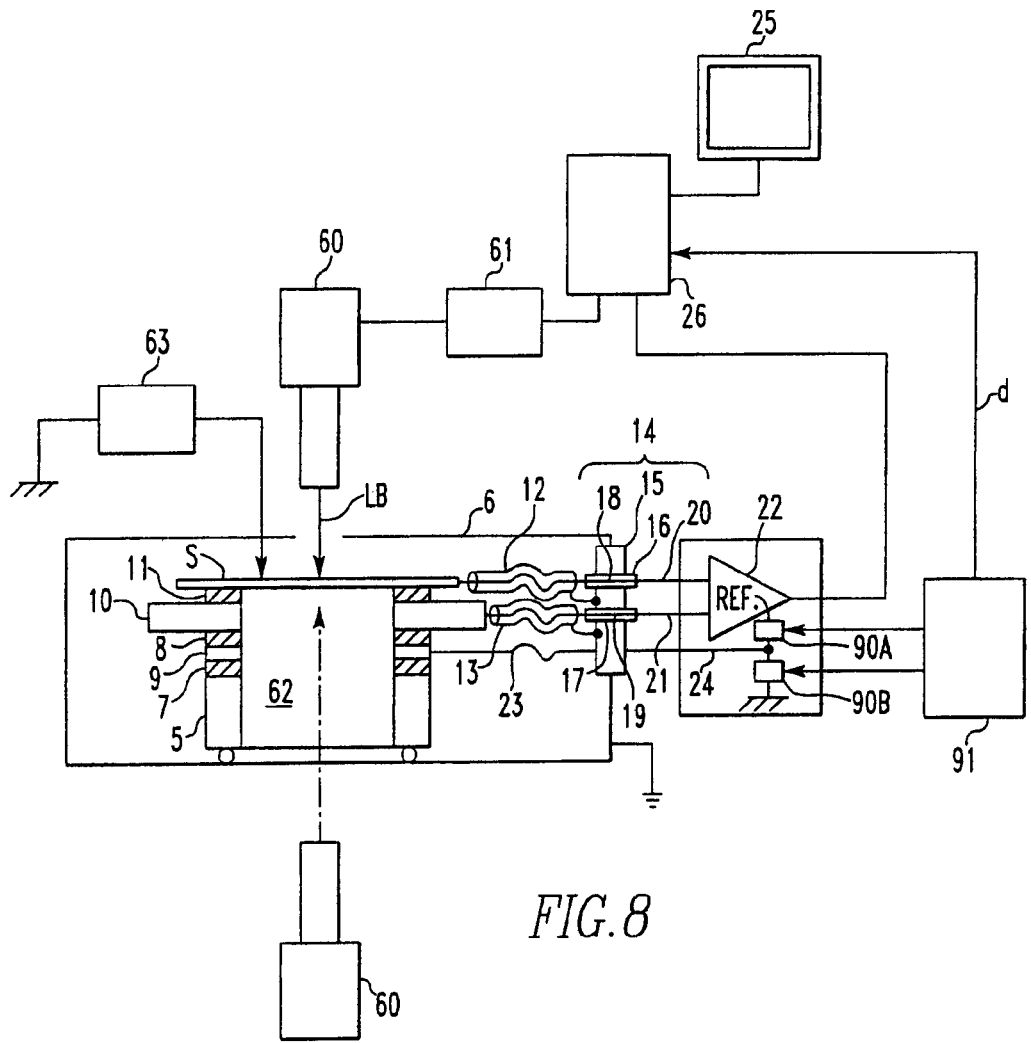

FIG. 14 is a diagram showing the configuration of still another embodiment of the present invention taking account of such experimental results. The present embodiment is based on the configuration of FIG. 10 and further characterized in that an amplifier 22A for imaging and an amplifier 22B for current measurements are separately provided such that current measurements and imaging give good results. The frequency characteristics and the gains of the amplifiers are independently set to be suitable for imaging and current measurements, respectively. In FIG. 14, switches 35–38 are measurement mode selector switches for selectively connecting lead wires 20 and 21 with the amplifiers 22A and 22B according to the measurement mode. The lead wires 20 and 21 are brought out via the terminal 14. The connection is switched according to a measurement mode-indicating signal from the control unit 26.

When the switches 35–38 are in the state of FIG. 14, the mode is the current measurement mode. The lead wire 20 is connected with one input terminal of the amplifier 22B via the switch 38. The other input terminal of the amplifier 22B and the lead wire 21 are grounded by the switches 35–37. In this mode, the circuit shown in FIG. 13(B) is built. A signal for a current measurement is taken from the amplifier 22B and sent to the control unit 26. This signal for a current measurement is obtained under conditions where the effects of movement of the specimen are small as shown in FIG. 13(B2).

On the other hand, when the switches 35–38 are in the state opposite to the state of FIG. 14, the mode is the imaging mode. In this mode, the lead wire 20 is connected with one input terminal of the amplifier 22A via the switch 38. The lead wire 21 is connected with the other input terminal of the amplifier 22A via the switches 35–37. A signal for imaging is taken from the amplifier 22A and sent to the control unit 26. This signal for imaging is obtained under conditions where only a small amount of noise of the AC line frequency is introduced as shown in FIG. 13(A1).

Whether the mode of operation is the current measurement mode or the imaging mode, the control unit 26 turns on the switches 33 and 34 during movement made by the specimen-moving mechanism 5 to ground the input terminal of the amplifier 22A or 22B in the same way as in the embodiment illustrated in FIG. 10. After the movement, when the specimen is impinged with the electron beam under a stationary condition to measure the specimen current, the switches 33 and 34 are turned off. Because of this sequence of control operations, the same advantages as produced by the embodiment illustrated in FIG. 10 can be derived in both modes.

Figure 15:
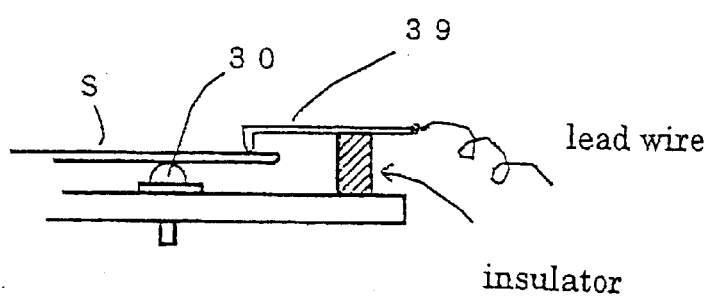
FIG. 15 is a diagram of another embodiment in which a specimen current is detected using a needle electrode.

In the embodiments illustrated in FIGS. 10 and 14, the specimen current is detected using the pins 30 and the holddown rollers 31. The pins 30 support the underside of the specimen, while the rollers 31 touch the fringes of the specimen. As shown in FIG. 15, a needle electrode 39 may be pushed against the specimen surface, and the specimen current may be detected using this electrode 39.

It is to be understood that the present invention is not limited to the aforementioned scanning electron microscope and laser microscope. The present invention can also be applied to cases in which an electrical current flowing through a specimen is measured in an electron probe microanalyzer (EPMA) or other specimen analysis instrument using a charged-particle beam.

As described in detail thus far, the present invention achieves a specimen analysis instrument capable of precisely amplifying a quite weak electrical current induced in a specimen by illuminating it with a primary beam.

Having thus described our invention with the detail and particularity required by the Patent Laws, what is desired protected by Letters Patent is set forth in the following claims.

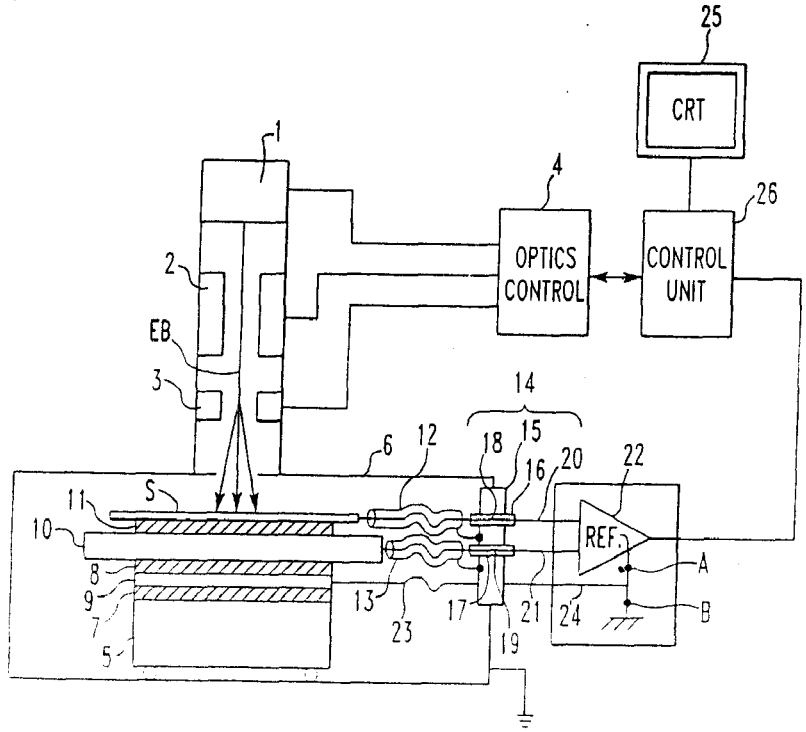

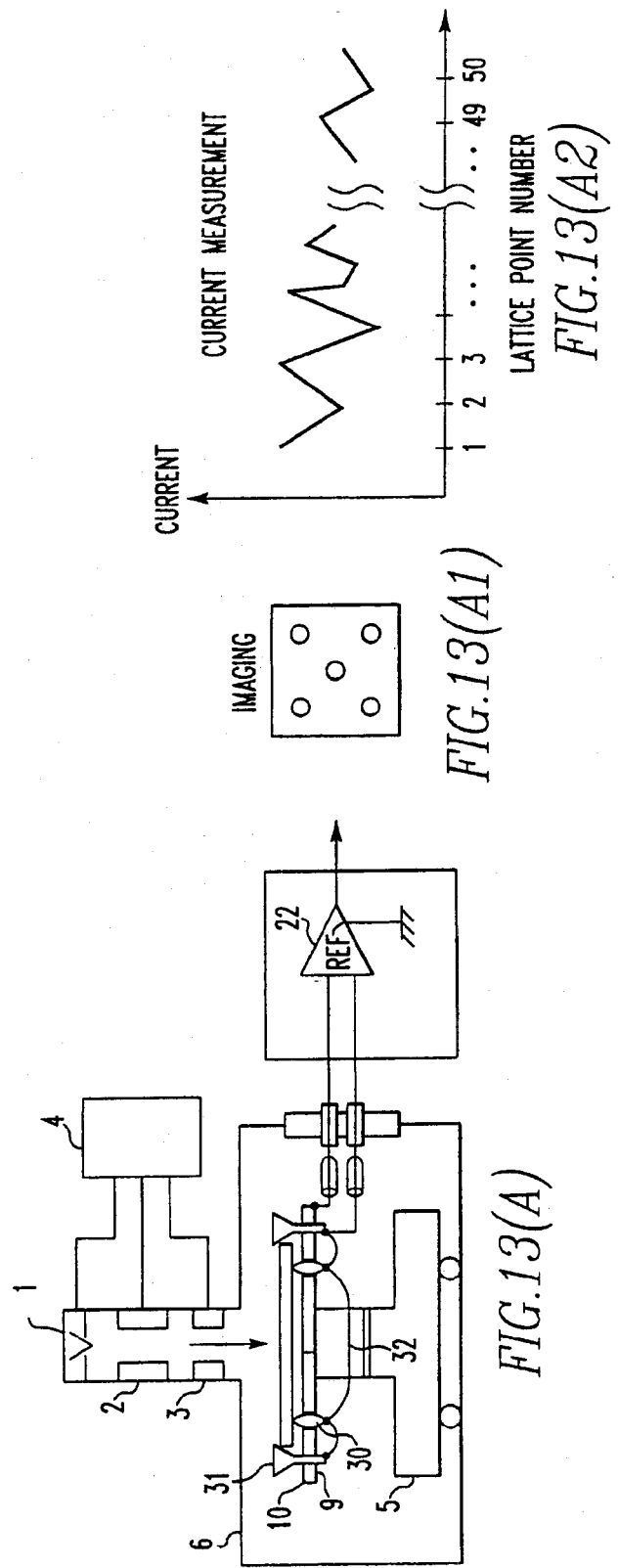

What is claimed is:

1. A specimen analysis instrument for inspecting a specimen by impinging a primary beam onto a surface of the specimen insulatively held to a specimen-moving mechanism mounted within a specimen chamber having a wall, detecting an electrical current induced across the specimen with a detector, and inspecting the specimen based on a resulting detector output signal, said specimen analysis instrument comprising:
   an amplifier having a reference input terminal and placed outside said specimen chamber to amplify the detector output signal;
   a first lead wire for passing the detector output signal to said outside amplifier through the wall of said specimen chamber;
   a conductive partition member insulatively inserted between said specimen and said specimen-moving mechanism to form a partition electrically isolated therefrom; and
   a second lead wire for connecting said conductive partition member with a conducting member and with said reference input terminal, said conducting member being placed around a portion of said first lead wire passing through the wall of said specimen chamber, said reference input terminal determining a reference potential for the output from said amplifier.

2. The specimen analysis instrument of claim 1, wherein
   (A) a differential amplifier is used as said amplifier,
   (B) an antenna means for detecting noise signals also detected by the specimen, and
   (C) there is further provided a third lead wire to pass a signal from said antenna means out of said specimen chamber through the wall of said specimen chamber into another input terminal of said differential amplifier.

3. The specimen analysis instrument of claim 2, wherein a conductive specimen holder for holding said specimen is used as said antenna means.

4. The specimen analysis instrument of claim 2 or 3, wherein a feedthrough terminal is mounted in the wall of said specimen chamber to bring said first and third lead wires to the outside through the wall of said specimen chamber, and wherein said conducting member is mounted to surround said feedthrough terminal.

5. The specimen analysis instrument of claim 4, wherein said conducting member is insulatively mounted to the wall of said specimen chamber and has a means permitting one to set the potential at said conducting material to a desired value.

6. The specimen analysis instrument of claim 3, wherein said first lead wire is connected with an electrode in contact with a surface of said specimen on which said primary beam impinges, and wherein the other surface of said specimen is electrically connected with said specimen holder.

7. A specimen analysis instrument for inspecting a specimen by impinging a primary beam onto a surface of the specimen insulatively held to a specimen-moving mechanism mounted within a specimen chamber having a wall, detecting an electrical current induced across the specimen with a detector, and inspecting the specimen based on a resulting detector output signal, said specimen analysis instrument comprising:
   a differential amplifier having a reference input terminal and placed outside said specimen chamber to amplify the detector output signal;
   a first lead wire for passing the detector output signal to said outside amplifier through the wall of said specimen chamber;
   a second lead wire for connecting said specimen-moving mechanism with a conducting member and with said reference input terminal of said differential amplifier, said conducting material being placed around a portion of said first lead wire passing through the wall of said specimen chamber, said reference input terminal determining a reference potential for the output from said amplifier;
   a conductive specimen holder acting to hold said specimen and insulatively held by said specimen-moving mechanism; and
   a third lead wire for passing a signal from said specimen holder to a second input terminal of said outside differential amplifier through the wall of said specimen chamber.

8. A specimen analysis instrument for inspecting a specimen by impinging a primary beam onto a surface of the specimen, detecting an electrical current induced across the specimen with a detector, and inspecting the specimen based on a resulting detector output signal, said specimen analysis instrument comprising:
   an antenna means for detecting noise signals also detected by the specimen;
   a means for taking the difference between a signal from said antenna and the electrical current flowing through said specimen as said detector output signal, said difference taking means having input terminals;

a first lead wire for passing the detector output signal to said difference taking means; and a second lead wire for passing a signal from said antenna means to said difference taking means.

9. The specimen analysis instrument of claim 8, wherein said specimen is placed within an electromagnetically shielded chamber together with said specimen-moving chamber.

10. A specimen analysis instrument for inspecting a specimen by impinging a primary beam onto a surface of the specimen insulatively held to a specimen-moving mechanism placed within a specimen chamber, detecting an electrical current induced across the specimen with a detector, and inspecting the specimen based on a resulting detector output signal, said specimen analysis instrument comprising:

a differential amplifier for amplifying said detector output signal, said differential amplifier having input terminals;

a first lead wire for passing the detected electrical current flowing through the specimen to said differential amplifier;

an antenna means for detecting noise signals also detected by the specimen, a second lead wire for passing a signal from said antenna to said differential amplifier; and a selector means for switching the input terminals of said differential amplifier between a grounded state and an ungrounded state.

11. The specimen analysis instrument of claim 10, further comprising a control means for controlling said selector means in such a way that the input terminals of said differential amplifier are not grounded for a period in which the electrical current flowing through said specimen is detected using said differential amplifier and that the input terminals of said differential amplifier are grounded during all or some of the remaining period.

12. The specimen analysis instrument of claim 10 or 11, wherein a conductive specimen holder for holding said specimen is used as said antenna.

13. The specimen analysis instrument of claim 10 or 11, wherein the electrical current flowing through said specimen is detected via a plurality of pins insulatively mounted to said specimen holder to support the underside of said specimen.

14. A specimen analysis instrument for inspecting a specimen by impinging a primary beam onto a surface of the specimen insulatively held to a specimen-moving mechanism placed within a specimen chamber, detecting an electrical current induced across the specimen with a detector, and inspecting the specimen based on a resulting detector output signal, said specimen analysis instrument comprising:

a differential amplifier for amplifying said detector output signal, said differential amplifier having input terminals;

a first lead wire for passing the detected electrical current flowing through the specimen to said differential amplifier;

an antenna means for detecting noise signals also detected by the specimen;

a second lead wire for passing a signal from said antenna to said differential amplifier; and a single-input amplifier for amplifying the detected current taken out via said first lead wire.

15. The specimen analysis instrument of claim 14, further comprising a selector means for switching the state of said specimen analysis instrument between a state in which said first and second lead wires are connected with said differential amplifier and a state in which said first lead wire is connected with said single-input amplifier.

16. The specimen analysis instrument of claim 14 or 15, further comprising:

a selector means for switching said first and second lead wires between a grounded state and an ungrounded state; and a control means for controlling said selector means in such a way that none of said first and second lead wires are grounded for a period in which the electrical current flowing through said specimen is detected using said differential amplifier or single-input amplifier and that said first and second lead wires are grounded during all or some of the remaining period.

* * * * *

UNITED STATES PATENT AND TRADEMARK OFFICE
CERTIFICATE OF CORRECTION

PATENT NO. : 6,653,629 B2
DATED : November 25, 2003
INVENTOR(S) : Yukihiro Tanaka et al.

It is certified that error appears in the above-identified patent and that said Letters Patent is hereby corrected as shown below:

The title page should be deleted and substitute the attached title page.

Delete drawing sheets 1-12, and substitute the drawing sheets, consisting of Figs. 1-14 as shown on the attached pages.

Signed and Sealed this

Thirtieth Day of May, 2006

JON W. DUDAS
*Director of the United States Patent and Trademark Office*

(12) United States Patent
Tanaka et al.

(10) Patent No.: US 6,653,629 B2
(45) Date of Patent: Nov. 25, 2003

(54) SPECIMEN INSPECTION INSTRUMENT

(75) Inventors: Yukihiro Tanaka, Saitama (JP); Sadao Matsumoto, Tokyo (JP); Toru Ishimoto, Saitama (JP); Hirofumi Miyao, Tokyo (JP)

(73) Assignee: JEOL Ltd., Tokyo (JP)

( * ) Notice: Subject to any disclaimer, the term of this patent is extended or adjusted under 35 U.S.C. 154(b) by 83 days.

(21) Appl. No.: 09/876,853

(22) Filed: Jun. 7, 2001

(65) Prior Publication Data
US 2002/0008201 A1 Jan. 24, 2002

(30) Foreign Application Priority Data
Jun. 9, 2000 (JP) .......................... 2000-173385

(51) Int. Cl.⁷ ........................... G01N 23/00; G21K 7/00

(52) U.S. Cl. ..................... 250/306; 250/307; 250/311

(58) Field of Search ............................ 250/306, 307, 250/310, 311

(56) References Cited

U.S. PATENT DOCUMENTS

| | | | |
|---|---|---|---|
| 5,466,936 A | * | 11/1995 | Kohama et al. ............ 250/310 |
| 5,939,715 A | * | 8/1999 | Kitamura et al. ........... 250/234 |
| 6,465,781 B1 | * | 10/2002 | Nishimura et al. ......... 250/306 |

* cited by examiner

Primary Examiner—John R. Lee
Assistant Examiner—Paul M. Gurzo
(74) Attorney, Agent, or Firm—Webb Ziesenheim Logsdon Orkin & Hanson, P.C.

(57) ABSTRACT

A specimen inspection instrument has a specimen-moving mechanism mounted within a specimen chamber. An electrical current, induced across the specimen by the mechanism, is detected with a detector. The specimen is examined based on the obtained detector output signal. An amplifier for amplifying the detector output signal is placed outside the specimen chamber. A first lead wire passes the detector output signal to the outside amplifier through the wall of the specimen chamber. A second lead wire connects a conductive partition member with a conducting member and with a reference input terminal of the amplifier that determines a reference potential for the output from the amplifier.

16 Claims, 11 Drawing Sheets